US009312298B2

(12) United States Patent
Yamashita

(10) Patent No.: US 9,312,298 B2
(45) Date of Patent: Apr. 12, 2016

(54) SOLID-STATE IMAGING DEVICE WITH A SIGNAL STORING PORTION INCLUDING FIRST AND SECOND SEMICONDUCTOR REGIONS

(71) Applicant: Kabushiki Kaisha Toshiba, Minato-ku (JP)

(72) Inventor: Hirofumi Yamashita, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/473,204

(22) Filed: Aug. 29, 2014

(65) Prior Publication Data

US 2015/0228684 A1 Aug. 13, 2015

(30) Foreign Application Priority Data

Feb. 10, 2014 (JP) ................. 2014-023604

(51) Int. Cl.
*H01L 27/14* (2006.01)
*H01L 27/146* (2006.01)

(52) U.S. Cl.
CPC ...... *H01L 27/14643* (2013.01); *H01L 27/1461* (2013.01); *H01L 27/1463* (2013.01); *H01L 27/1464* (2013.01); *H01L 27/14603* (2013.01); *H01L 27/14607* (2013.01); *H01L 27/14612* (2013.01); *H01L 27/14614* (2013.01); *H01L 27/14627* (2013.01); *H01L 27/14638* (2013.01); *H01L 27/14641* (2013.01); *H01L 27/14689* (2013.01)

(58) Field of Classification Search
CPC ................................. H01L 27/14607
See application file for complete search history.

(56) References Cited

U.S. PATENT DOCUMENTS

2009/0303371 A1 12/2009 Watanabe et al.
2010/0193845 A1 8/2010 Roy et al.
2011/0019050 A1 1/2011 Yamashita
(Continued)

FOREIGN PATENT DOCUMENTS

JP 2009-206356 9/2009
JP 2010-114274 5/2010
(Continued)

OTHER PUBLICATIONS

Notice of Preliminary Rejection issued Nov. 3, 2015 in Korean Patent Application No. 10-2014-0112368 (with English language translation).
Office Action issued Dec. 29, 2015 in Taiwanese Patent Application No. 103127911 (with English translation).

*Primary Examiner* — Daniel Whalen
(74) *Attorney, Agent, or Firm* — Oblon, McClelland, Maier & Neustadt, L.L.P.

(57) ABSTRACT

According to one embodiment, in a solid-state imaging device, a signal storage portion in each of a plurality of pixels includes a first semiconductor region and a second semiconductor region. The first semiconductor region is of a first conductive type. The first semiconductor region coveres a side wall of an element isolation portion on a side of the signal storage portion. The second semiconductor region is of a second conductive type. The second conductive type is an opposite conductive type to the first conductive type. The second semiconductor region is arranged vertically in a depth direction from a deeper position than a front surface in a semiconductor substrate and extending in a plate shape along the first semiconductor region.

27 Claims, 33 Drawing Sheets

(56) References Cited

U.S. PATENT DOCUMENTS

| | | |
|---|---|---|
| 2011/0183709 A1 | 7/2011 | Roy |
| 2013/0049155 A1 | 2/2013 | Roy et al. |
| 2013/0221410 A1 | 8/2013 | Ahn |
| 2013/0307040 A1 | 11/2013 | Ahn et al. |

FOREIGN PATENT DOCUMENTS

| | | |
|---|---|---|
| JP | 2013-30803 | 2/2013 |
| KR | 10-2013-0083361 A | 7/2013 |

↓ION IMPLANTATION (V)

US 9,312,298 B2

SOLID-STATE IMAGING DEVICE WITH A SIGNAL STORING PORTION INCLUDING FIRST AND SECOND SEMICONDUCTOR REGIONS

CROSS-REFERENCE TO RELATED APPLICATIONS

This application is based upon and claims the benefit of priority from Japanese Patent Application No. 2014-023604, filed on Feb. 10, 2014 which are incorporated herein by reference.

FIELD

Embodiments described herein relate generally to a solid-state imaging device.

BACKGROUND

Solid-state imaging devices including a CMOS sensor are currently used for various purposes such as a digital still camera, a video movie, and a monitoring camera. The following imaging properties are requested for the application to a digital camera, a video movie, a monitoring camera, and the like. In other words, image capture can be performed at a high S/N ratio when a dark object is imaged, and further the image output resolution is provided also when a sufficiently bright object is imaged. In this manner, if the S/N ratio at the time of imaging a dark object is excellent, and also a bright object can be imaged, there are advantages that an image with what is called a wide dynamic range can be captured and that natural reproduction similar to one through the human eyes is achievable. However, in recent years, a request to reduce the size of an imaging optical system is strong. On the other hand, a request of high resolution is also increasing at the same time There are tendencies to reduce the pixel size. Therefore, it is becoming difficult to obtain such an image with a wide dynamic range as above. The circumstances are described below.

In other words, if the area of each pixel is reduced, then the area of a photodiode that accumulates signal charge generated by photoelectric conversion in the pixel is also reduced accordingly at the same time. However, the upper limit of the amount of signal charge that can be stored in the photodiode is roughly corresponding to the area of the photodiode. Accordingly, if the area of the pixel is reduced, the upper limit of the number of signal charge that can be stored in the photodiode, that is, the number of saturation electrons is reduced at the same time. In this case, image information of signals above the number of saturation electrons cannot be obtained. Accordingly, there arises a limit to the brightness at which a object can be imaged. Hence, it becomes difficult to obtain an image with a wide dynamic range.

Furthermore, when the area of each pixel is reduced, the following problem can occur: In other words, if the area of a pixel is reduced, the size of a MOS transistor configuring an output circuit placed in the pixel is also reduced at the same time. However, if the size of the MOS transistor configuring the output circuit of the pixel, for example, an amplifier transistor configuring a source follower circuit to serve as the output circuit, is reduced, 1/f noise or RTA (Random Telegraph Signal) noise occurring in there is increased. If so, when a dark object is being imaged and the amount of signal charge is small, the S/N ratio against the noise is reduced. Accordingly, in this case, a playback image may become a low quality image with much noise.

Furthermore, when the area of each pixel is reduced, the following problem can occur: In other words, if the area of each pixel is reduced, light incident on a pixel tends to leak into an adjacent pixel. However, a color filter to acquire a different color signal is generally placed in the adjacent pixel. Accordingly, in this case, color mixing may occur severely. Moreover, even if incident light does riot leak out to the adjacent pixel, when photoelectrons are generated in a part close to the boundary between pixels within a semiconductor region configuring a pixel, the photoelectrons leak into an adjacent pixel due to thermal diffusion or the like. Accordingly, color mixing may be increased due to a similar reason. If the degree of color mixing is high, color reproducibility reduces. Accordingly, it becomes difficult to obtain an image with high saturation on a playback screen.

DETAILED DESCRIPTION

In general, according to one embodiment, there is provided a solid-state imaging device including a plurality of pixels and an element isolation portion. The plurality of pixels are arranged on a semiconductor substrate. Each of the plurality of pixels includes a signal storage portion. The element isolation portion is a DTI (Deep Trench Isolation) type element isolation portion. The element isolation portion electrically separates the plurality of pixels on the semiconductor substrate from each other. The signal storage portion in each of the plurality of pixels includes a first semiconductor region and a second semiconductor region. The first semiconductor region is of a first conductive type. The first semiconductor region coveres a side wall of the element isolation portion on a side of the signal storage portion. The second semiconductor region is of a second conductive type. The second conductive type is an opposite conductive type to the first conductive type. The second semiconductor region is arranged vertically in a depth direction from a deeper position than a front surface in the semiconductor substrate and extending in a plate shape along the first semiconductor region.

Exemplary embodiments of a solid-state imaging device will be explained below in detail with reference to the accompanying drawings. The present invention is not limited to the following embodiments.

(First Embodiment)

Figure 1:
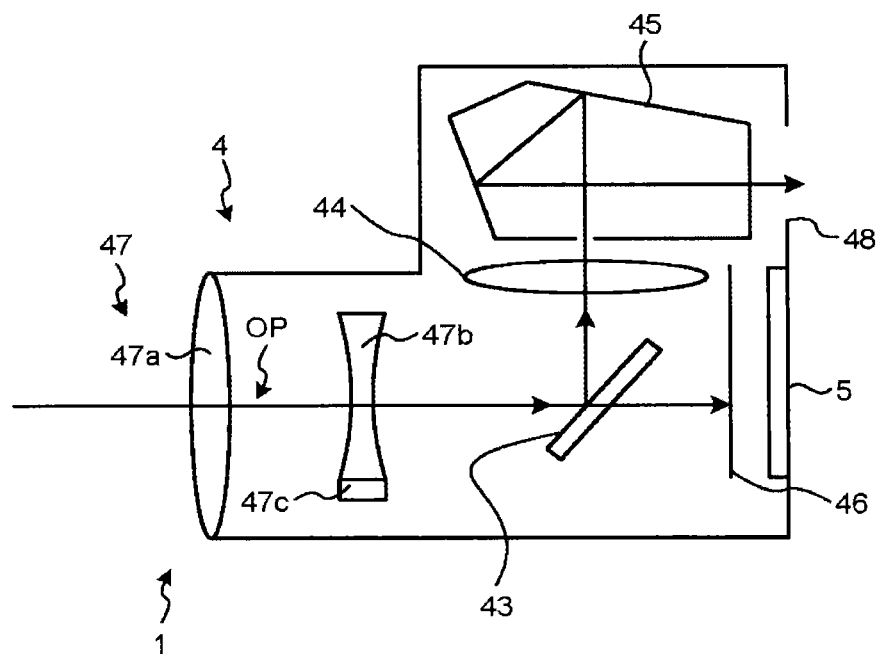
FIG. 1 is a diagram illustrating a configuration of an imaging system to which a solid-state imaging device according to a first embodiment is applied.
Figure 2:
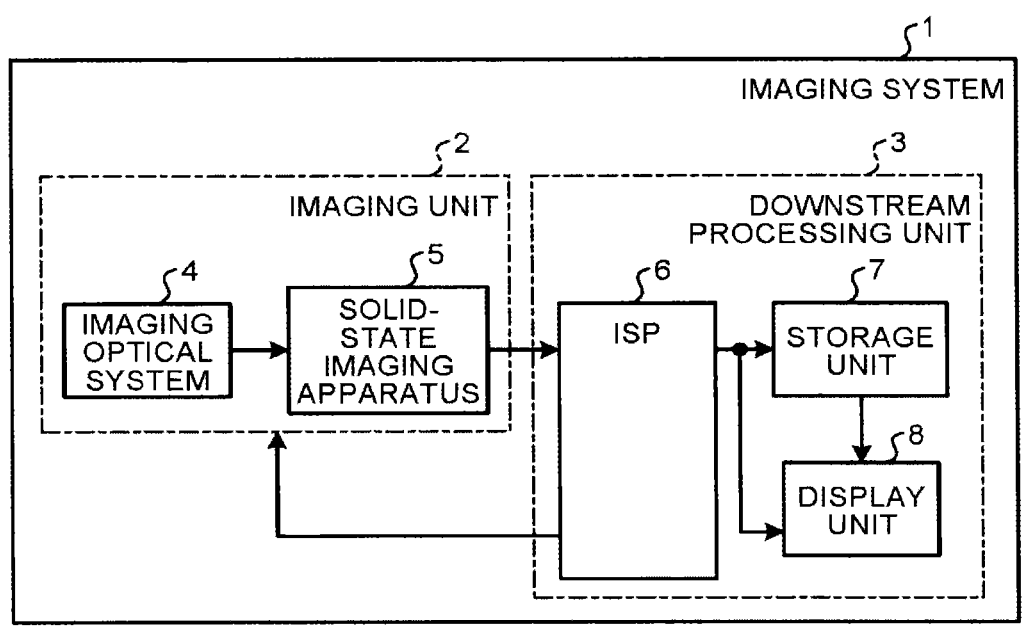
FIG. 2 is a diagram illustrating a configuration of the imaging system to which the solid-state imaging device according to the first embodiment is applied.

A solid-state imaging device according to a first embodiment will be explained. The solid-state imaging device is applied to, for example, an imaging system illustrated in FIGS. 1 and 2. FIGS. 1 and 2 are diagrams illustrating a schematic configuration of the imaging system. In FIG. 1, OP denotes the optical axis.

An imaging system 1 may be, for example, a digital camera or digital video camera, or one in which a camera module is applied to electronic equipment (for example, a mobile terminal with a camera). The imaging system 1 includes an imaging unit 2 and a downstream processing unit 3 as illustrated in FIG. 2. The imaging unit 2 is, for example, a camera module. The imaging unit 2 includes an imaging optical system 4, and a solid-state imaging device 5. The downstream processing unit 3 includes an ISP (Image Signal Processor) 6, a storage unit 7, and a display unit 8.

The imaging optical system 4 includes an imaging lens 47, a half mirror 43, a mechanical shutter 46, a lens 44, a prism 45, and a finder 48. The imaging lens 47 includes imaging lenses 47a and 47b, a diaphragm (not illustrated), and a lens drive mechanism 47c. The diaphragm is arranged between the imaging lenses 47a and 47b, and adjusts the amount of light directed to the imaging lens 47b. In FIG. 1, the case where the imaging lens 47 includes two imaging lenses 47a and 47b is illustrated by example. However, the imaging lens 47 may include multiple imaging lenses.

The solid-state imaging device 5 is placed on a predicted image plane of the imaging lens 47. For example, the imaging lens 47 refracts incident light, directs the light to an imaging surface of the solid-state imaging device 5 via the half mirror 43 and the mechanical shutter 46, and forms an object image on the imaging surface (imaging area IR) of the solid-state imaging device 5. The solid-state imaging device 5 generates an image signal in accordance with the object image.

Figure 3:
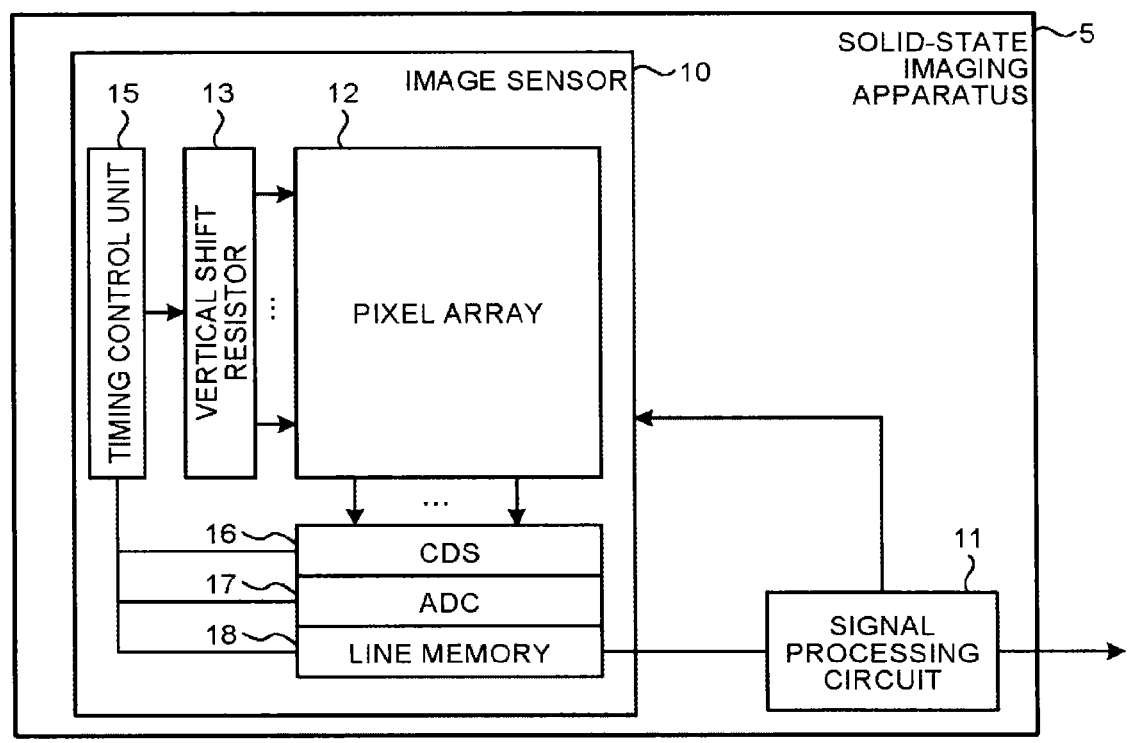
FIG. 3 is a diagram illustrating a circuit configuration of the solid-state imaging device according to the first embodiment.

The solid-state imaging device 5 includes an image sensor 10 and a signal processing circuit 11 as illustrated in FIG. 3. FIG. 3 is a diagram illustrating a circuit configuration of the solid-state imaging device. The image sensor 10 may be, for example, a CMOS image sensor, or another amplifying solid-state imaging device. The image sensor 10 includes a pixel array 12, a vertical shift register 13, a timing control unit 15, a correlated double sampling unit (CDS) 16, an analog/digital conversion unit (ADC) 17, and a line memory 18.

Figure 4A:
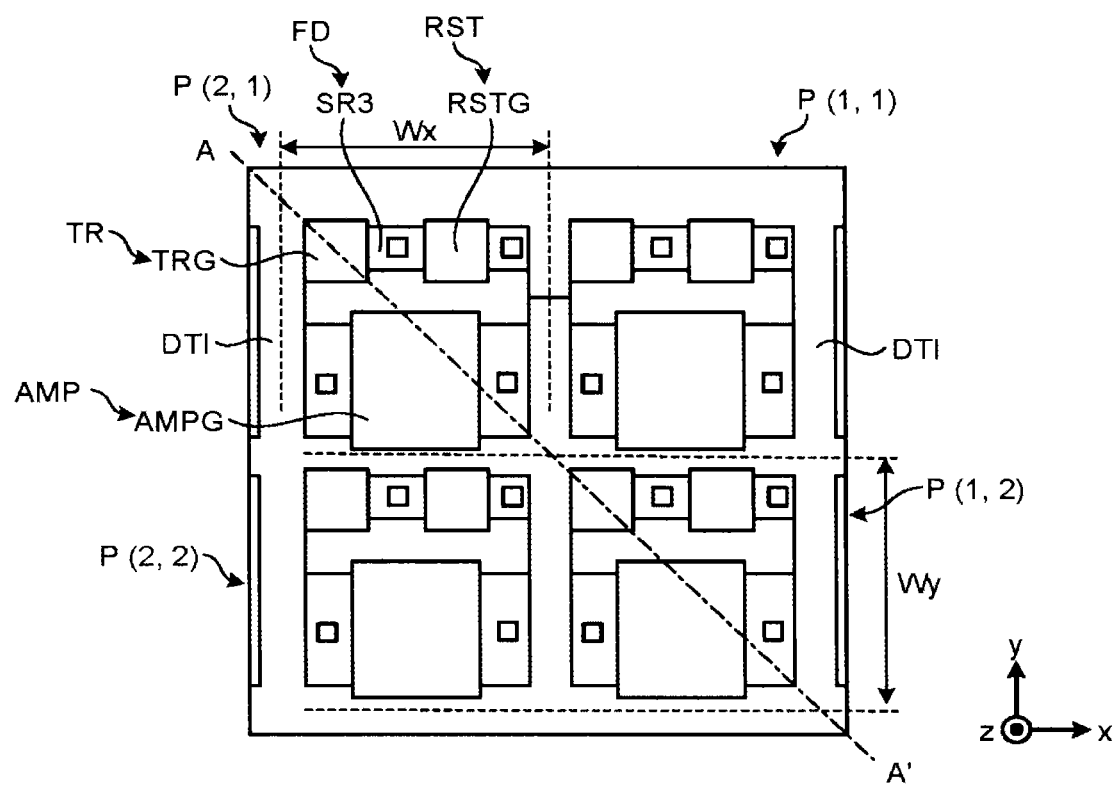
FIG. 4A is a diagram illustrating a layout configuration of the solid-state imaging device according to the first embodiment.

In the pixel array 12, a plurality of pixels P is arranged two-dimensionally. For example, FIG. 4A illustrates the two-row by two-column array of pixels P(1, 1) to P(2, 2) in the pixel array 12. FIG. 4A is a diagram illustrating a layout configuration of the plurality of pixels P in the solid-state imaging device 5. In the following, a direction perpendicular to a front surface of a semiconductor substrate is defined as a z direction, and two directions perpendicular to each other in a plane orthogonal to the z direction are defined as an x direction and a y direction. The x direction is a direction along a column of the pixel array 12. The y direction is a direction along a row of the pixel array 12.

At this time, if the area of the pixel array 12 is restricted to a predetermined area, it is necessary to make the area of each pixel P in the planar direction smaller to increase the number of pixels in the pixel array 12 and improve the resolution. For example, the area of each pixel P in the planar direction is made smaller by reducing a width Wx of each pixel P in the x direction, reducing a width Wy in the y direction, or reducing both the width Wx in the x direction and the width Wy in the y direction.

Suppose that a signal storage portion that stores signal charges generated by a photodiode is configured to be of flat type. In the signal storage portion, a second conductive type (for example, N-type) semiconductor region is formed along the front surface of the semiconductor substrate in the vicinity of the front surface of the semiconductor substrate, and a P-N junction structure is formed between the semiconductor region and a first conductive type (for example, P-type) semiconductor region in a bottom layer. The P-N junction structure includes a P-N junction interface along the front surface of the semiconductor substrate. Accordingly, if the area of each pixel P in the planar direction is made smaller, the area of the P-N junction interface in each pixel P also reduces. Consequently, if the P-N junction structure is equivalently regarded as a capacitive element, the area of an electrode of the equivalent capacitive element is reduced and the capacitance value of the P-N junction structure reduces. Accordingly, there may be reductions in the amount of charge that can be stored in a signal storage portion PD of each pixel P, and the sensitivity of the signal storage portion PD can be deteriorated.

Hence, in the first embodiment, in the solid-state imaging device 5, the signal storage portion PD (P-N junction structure) of each pixel is configured to be of vertical type and the area of the P-N junction interface in the depth direction (z direction) is secured. Accordingly, it is aimed to increase the maximum storage amount of charge (for example, the maximum storage number of electrons) that can be stored in the signal storage portion PD while the area of each pixel in the planar direction is made smaller.

Figure 4B:
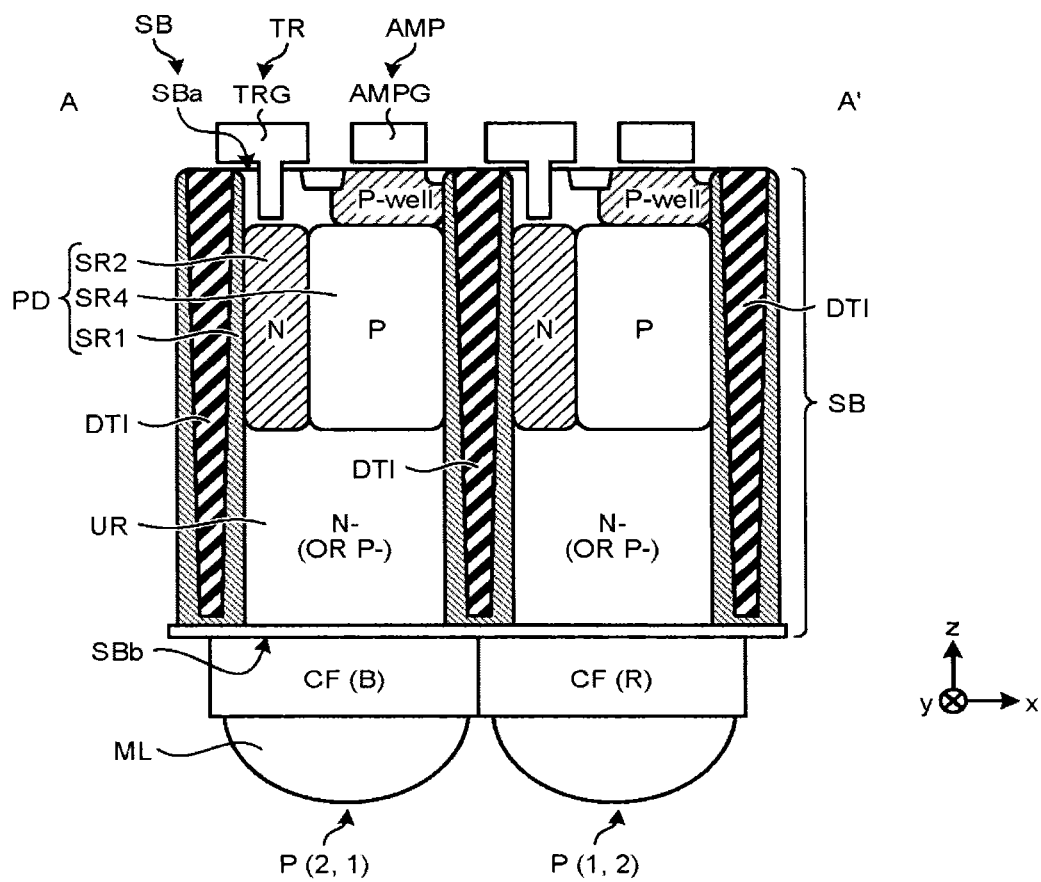
FIG. 4B is a diagram illustrating a cross-sectional configuration of the solid-state imaging device according to the first embodiment.

Specifically, the solid-state imaging device 5 is configured to be of a backside illumination type as illustrated in FIG. 4B. FIG. 4B is a diagram illustrating a cross section cut along line A-A' of FIG. 4A. In other words, in each pixel P in the solid-state imaging device 5, a microlens ML and a color filter CF are arranged on a back surface SBb side of a semiconductor substrate SB, and the signal storage portion PD is arranged in the semiconductor substrate SB. At this time, the signal storage portion PD is configured to be of vertical type. Consequently, the solid-state imaging device 5 can store signal charges in the signal storage portion PD in the semiconductor substrate SB in accordance with light incident from the back surface SBb side of the semiconductor substrate SB, and read out the signal charges to a charge-voltage conversion portion FD on a front surface SBa side of the semiconductor substrate SB by a read-out gate (a transfer portion TR) after a fixed storage period.

For example, the solid-state imaging device 5 includes the plurality of pixels P and an element isolation portion DTI.

The plurality of pixels P is arranged on the semiconductor substrate SB. The plurality of pixels P is arranged two-dimensionally in a direction along the front surface SBa of the semiconductor substrate SB.

The element isolation portion DTI is arranged in the semiconductor substrate SB. The element isolation portion DTI extends, for example, in a grid form in planar view (see FIG. 13), and electrically separates the plurality of pixels P on the semiconductor substrate SB from each other. As illustrated in FIG. 4B, the element isolation portion DTI extends in the depth direction in the semiconductor substrate SB from the front surface SBa of the semiconductor substrate SB up to the vicinity of the back surface SBb in cross-sectional view.

Each pixel P includes, for example, the microlens ML, the color filter CF, the signal storage portion PD, the transfer potion TR, the charge-voltage conversion portion FD, a reset portion RST, and an amplifying portion AMP.

The microlens ML is arranged on the back surface SBb side of the semiconductor substrate SB. The microlens ML is configured to focus incident light onto a pixel for which the microlens ML is placed. The light incident on the microlens ML is directed to the color filter CF.

The color filter CF selectively directs, to the pixel, a light in a predetermined wavelength region among the incident light. For example, in the pixel P(2, 1) illustrated in FIG. 4B, the color filter CF selectively directs, to the pixel, a light in a wavelength region of blue among the incident light. For example, in the pixel P(1, 2) illustrated in FIG. 4B, the color filter CF selectively directs, to the pixel, a light in a wavelength region of red among the incident light.

The signal storage portion PD stores charge generated in response to the light received by the pixel. The signal storage portion PD is configured to be of vertical type.

Figure 5:
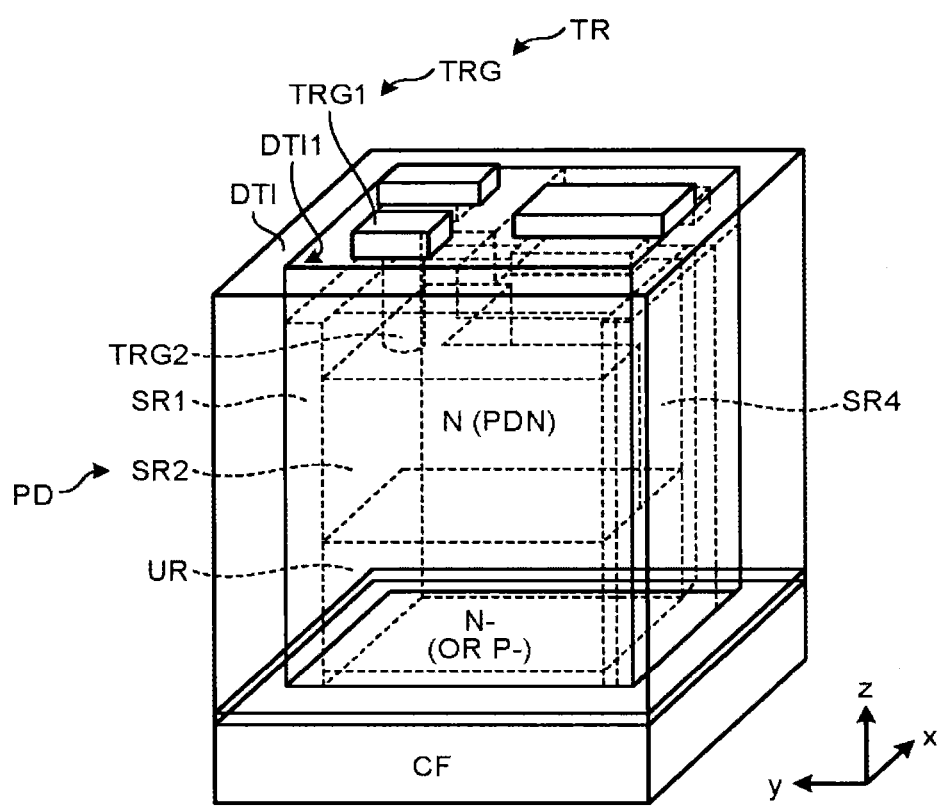
FIG. 5 is a diagram illustrating a configuration of a pixel in the first embodiment.

For example, the signal storage portion PD is configured as illustrated in FIG. 5. FIG. 5 is a transparent perspective view illustrating the configuration of the pixel P.

The signal storage portion PD is surrounded by the element isolation portion DTI when seen through from a direction perpendicular to the front surface SBa of the semiconductor substrate SB. The element isolation portion DTI is formed in, for example, a substantially square tube shape, and accommodates the signal storage portion PD and a underlying region UR therein. The underlying region UR is a semiconductor region between the signal storage portion PD and the color filter CF in the semiconductor substrate SB, and contains second conductive type (for example, N-type) impurities. The underlying region UR may contain first conductive type (for example, P-type) impurities instead of the second conductive type impurities. An insulating film may be arranged between the underlying region UR and the color filter CF.

The signal storage portion PD includes a semiconductor region (first semiconductor region) SR1, a semiconductor region (second semiconductor region) SR2, and a semiconductor region SR4.

The semiconductor region SR1 covers a side wall DTI1 of the element isolation portion DTI on the signal storage portion PD side. The semiconductor region SR1 has a shape corresponding to the element isolation portion DTI, and is formed in, for example, a substantially square tube shape. The semiconductor region SR1 contains the first conductive type (for example, P-type) impurities at a higher concentration than the concentration of the second conductive type impurities in the underlying region UR, and at a higher concentration than the concentration of the first conductive type impurities in the semiconductor region SR4. The P-type impurities are, for example, boron. The semiconductor region SR1 contains the first conductive type impurities at a higher concentration than the concentration of the second conductive type impurities in the semiconductor region SR2.

Figure 6A:
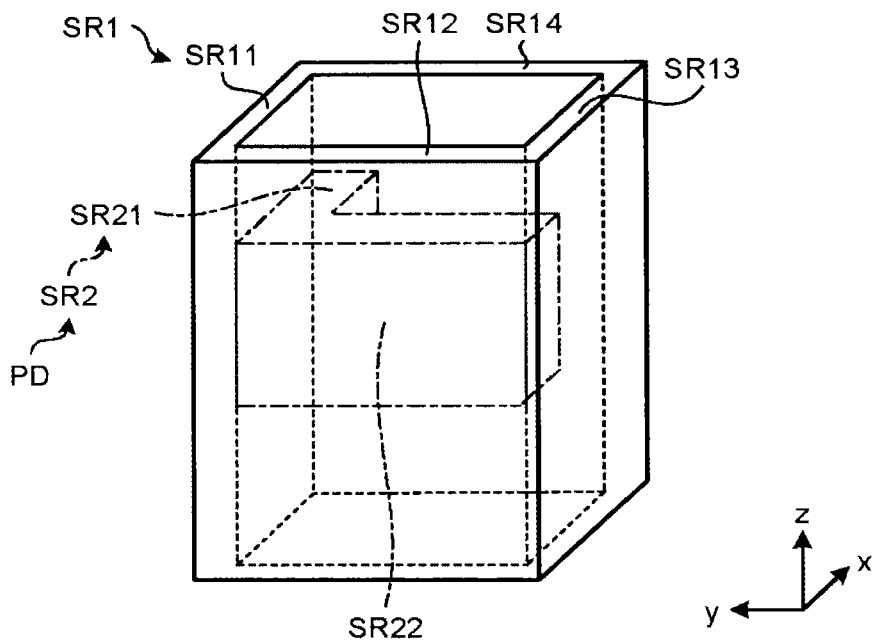
FIGS. 6A and 6B are diagrams illustrating the configuration of the pixel in the first embodiment.
Figure 6B:
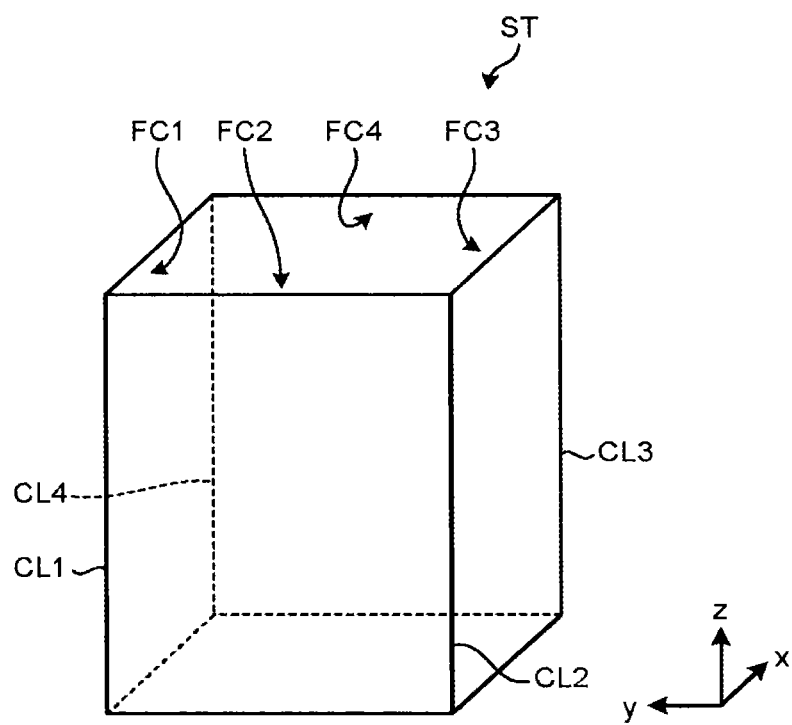

More specifically, the semiconductor region SR1 is configured as illustrated in FIGS. 6A and 6B. FIG. 6A is a transparent perspective view illustrating a part of a Si region inside the element isolation portion DTI within the configuration of the pixel P. FIG. 6B is a perspective view illustrating a virtual square tube corresponding to the configuration of the pixel P. The semiconductor region SR1 extends along, for example, such a square tube ST as illustrated in FIG. 6B. A surface (first surface) FC1 and a surface (second surface) FC2 of the square tube ST intersect on a cross line CL1. The surface FC2 and a surface (third surface) FC3 intersect on a cross line CL2. The cross line CL2 is located on an opposite side to the cross line CL1 in the surface FC2. The surface FC3 and a surface (fourth surface) FC4 intersect on a cross line CL3. The cross line CL3 is located on an opposite side to the cross line CL2 in the surface FC3. The surfaces FC4 and FC1 intersect on a cross line CL4. The cross line CL4 is located on an opposite side to the cross line CL3 in the surface FC4. The surfaces FC1, FC2, FC3, and FC4 are respectively surfaces of the square tube ST on +y, −x, −y, and +x sides. The cross lines CL1 to CL4 are lines extending in the z direction.

The semiconductor region SR1 includes sections SR11, SR12, SR13, and SR14 as illustrated in FIG. 6A. The section SR11 extends along the surface FC1 from a position corresponding to the cross line CL4 up to a position corresponding to the cross line CL1. The section SR12 extends along the surface FC2 from the position corresponding to the cross line CL1 up to a position corresponding to the cross line CL2. The section SR13 extends along the surface FC3 from the position corresponding to the cross line CL2 up to a position corresponding to the cross line CL3. The section SR14 extends along the surface FC4 from the position corresponding to the cross line CL3 up to the position corresponding to the cross line CL4.

Figure 7A:
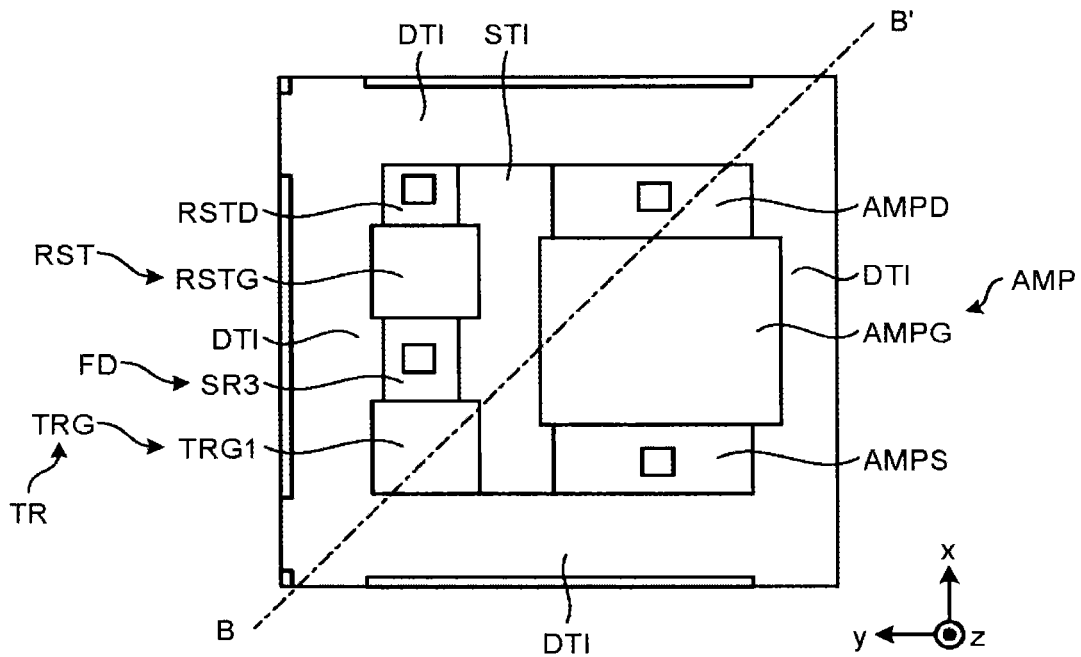
FIGS. 7A and 7B are diagrams illustrating the configuration of the pixel in the first embodiment.
Figure 7B:
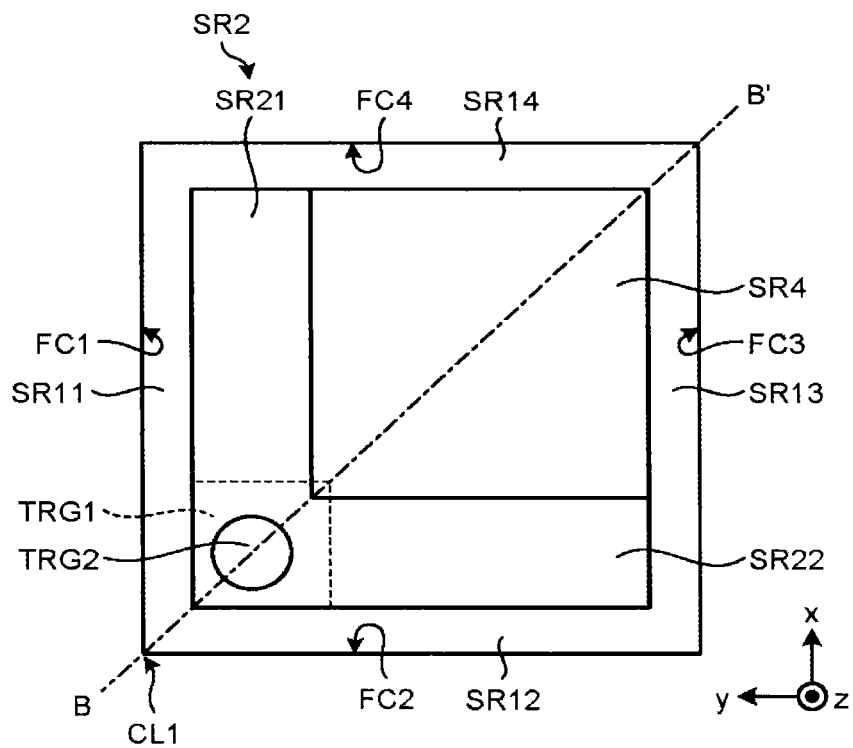
Figure 8:
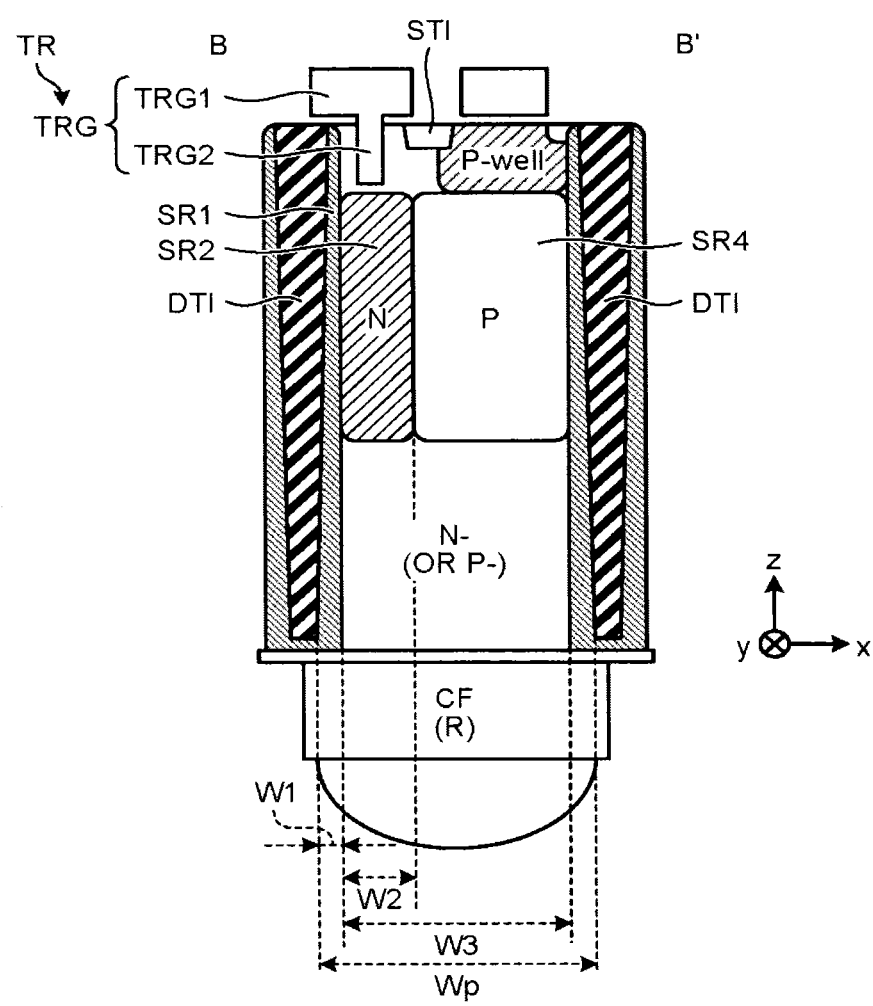
FIG. 8 is a diagram illustrating the configuration of the pixel in the first embodiment.

The semiconductor region SR2 is configured as illustrated in FIG. 6A to FIG. 8. FIGS. 7A and 7B are plan views illustrating the configuration of the pixel. FIG. 7A is a plan view of the semiconductor substrate SB in a state where a gate electrode, a source region, and a drain region of each transistor are arranged. FIG. 7B is a plan view when the configuration related to the semiconductor region SR2 in the semiconductor substrate SB is seen through from the direction perpendicular to the front surface SBa of the semiconductor substrate SB. FIG. 8 is a cross-sectional view cut along line B-B' of FIGS. 7A and 7B.

As illustrated in FIGS. 6A and 8, the semiconductor region SR2 is arranged vertically in the depth direction from a deeper position in the semiconductor substrate SB than the front surface SBa. As illustrated in FIG. 6A and 7B, the semiconductor region SR2 extends along the semiconductor region SR1 in a vertical plate shape. The semiconductor region SR2 contains the second conductive type (for example, N-type) impurities at a higher concentration than the concentration of the second conductive type impurities in the underlying region UR, and at a lower concentration than the concentration of the first conductive type impurities in the semiconductor region SR1. The N-type impurities are, for example, phosphorous or arsenic. The first conductive type is an opposite conductive type to the second conductive type.

More specifically, the semiconductor region SR2 includes a section (first section) SR21 and a section (second section) SR22 as illustrated in FIGS. 6A and 7B. The section SR21 extends along the section SR11 of the semiconductor region SR1. The section SR21 extends along the surface FC1 from a position corresponding to the cross line CL4 up to a position corresponding to the cross line CL1. The section SR22 extends along the section SR12 of the semiconductor region SR1. The section SR22 extends along the surface FC2 from the position corresponding to the cross line CL1 up to a position corresponding to the cross line CL2. The semiconductor region SR2 has a substantially L-shape when seen through from the direction perpendicular to the front surface SBa of the semiconductor substrate SB.

The semiconductor region SR4 defines the boundary of the semiconductor region SR2 such that the semiconductor region SR2 is formed to a vertical plate shape. In other words, the semiconductor region SR4 covers the semiconductor region SR2 from an opposite side to the semiconductor region SR1. The interface between the semiconductor regions SR2 and SR4 is along (for example, substantially parallel to) the interface between the semiconductor regions SR2 and SR1. The semiconductor region SR4 is arranged in such a mariner as to fill a space formed between the semiconductor regions SR1 and SR2 when the semiconductor region SR2 is formed to a vertical plate shape. The semiconductor region SR4 contains the first conductive type (for example, P-type) impurities at a higher concentration than the concentration of the second conductive type impurities in the underlying region UR, and at a lower concentration than the impurity concentration of the semiconductor region SR1.

For example, if the semiconductor region SR2 is formed in such a manner as to have a substantially L-shape when seen through from the direction perpendicular to the front surface SBa of the semiconductor substrate SB, a space is created which is surrounded by the sections SR21 and SR22 of the semiconductor region SR2 and the sections SR13 and SR14 of the semiconductor region SR1, as illustrated in FIGS. 7B and 8. The semiconductor region SR4 is arranged in a depth position corresponding to (for example, equal to) the semiconductor region SR2 in the semiconductor substrate SB in such a manner as to fill the space.

In the signal storage portion PD, as illustrated, for example, in FIG. 8, a P-N junction structure is formed between the semiconductor regions SR1 and SR2. The vicinity of the interface between the semiconductor regions SR1 and SR2 is a P-N junction interface. At this time, the P-N junction interface extends in the depth direction. Accordingly, even if the area (a planar width Wp) of each pixel P in the planar direction is made smaller, a large area of the P-N junction interface can be secured. Consequently, if the P-N junction structure is equivalently regarded as a capacitive element, the area of an electrode of the equivalent capacitive element can be secured, and the capacitance value of the P-N junction structure can be secured. Accordingly, it is possible to increase the amount of charge that can be stored in the signal storage portion PD of each pixel P and improve the sensitivity of the signal storage portion PD.

Suppose that there is not the semiconductor region SR4. In the cross section illustrated in FIG. 8, the width of the semiconductor region SR2 may be increased to a value W3 close to the width Wp of the pixel. In this case, if the P-N junction structure is equivalently regarded as a capacitive element, the space between electrodes of the equivalent capacitive element increases, and the capacitance value of the P-N junction structure reduces. Accordingly, there may be reductions in the amount of charge that can be stored in the signal storage portion PD of each pixel P, and the maximum storage amount of charge in the signal storage portion PD can be deteriorated. If the number of saturation electrons is attempted to be increased while the capacitance is small, a depletion potential is increased. When a signal electron is read out from the signal storage portion PD to the charge-voltage conversion portion FD via the read-out gate (the transfer portion TR), it is difficult to read out all signal electrons, and electrons tend to stay in the signal storage portion PD. Accordingly, an afterimage on the playback screen, nonlinearity of a signal, and the like may occur.

In contrast, in the embodiment, the semiconductor region SR4 defines the boundary of the semiconductor region SR2 such that the semiconductor region SR2 is formed to a vertical plate shape. Consequently, a width W2 of the semiconductor region SR2 in the planar direction (for example, the x direction) can be reduced dramatically compared with the value W3. Moreover, a width W1 of the semiconductor region SR1 in the planar direction is narrower than the width W2. In other words, if the P-N junction structure is equivalently regarded as a capacitive element, the space between the electrodes of the equivalent capacitive element can be reduced, and the capacitance value of the P-N junction structure can be secured. Accordingly, it is possible to increase the amount of charges that can be stored in the signal storage portion PD of each pixel P and increase the number of saturation electrons.

The transfer portion TR illustrated in FIGS. 5, 7A, and 8 transfers the charge stored in the signal storage portion PD to the charge-voltage conversion portion FD. The transfer portion TR is, for example, a vertical transfer transistor, and includes a trench gate TRG. The transfer portion TR transfers the charge of the signal storage portion PD to the charge-voltage conversion portion FD by being turned on when a control signal at an active level is supplied to the trench gate TRG, and does not transfer the charge of the signal storage portion PD to the charge-voltage conversion portion FD by being turned off when the control signal at a non-active level is supplied to the trench gate TRG.

The charge-voltage conversion portion FD converts the transferred charge into a voltage. The charge-voltage conversion portion FD is, for example, a floating diffusion, and includes a semiconductor region (third semiconductor region) SR3. The semiconductor region SR3 is arranged in the vicinity of the front surface SBa of the semiconductor substrate SB in the semiconductor substrate SB. The semiconductor region SR3 may be electrically separated from a channel stopper comprised of another semiconductor region arranged in the vicinity of the front surface SBa of the semiconductor substrate SB, an STI type element isolation portion or LOCOS type element isolation portion, and a first conductive type diffusion layer. Moreover, as illustrated in FIG. 7A, the semiconductor region SR3 is arranged at a position adjacent to the trench gate TRG in the semiconductor substrate SB in the vicinity of the front surface SBa of the semiconductor substrate SB.

The trench gate TRG includes a flat plate portion TRG1 and a trench portion TRG2. As illustrated in FIG. 8, the flat plate portion TRG1 is arranged on the front surface SBa of the semiconductor substrate SB. The trench portion TRG2 extends in the depth direction from the front surface of the semiconductor substrate SB up to the vicinity of the semiconductor region SR2. Consequently, the trench gate TRG can form a vertical channel region between the semiconductor regions SR2 and SR3 when the control signal at the active level is supplied.

Figure 9A:
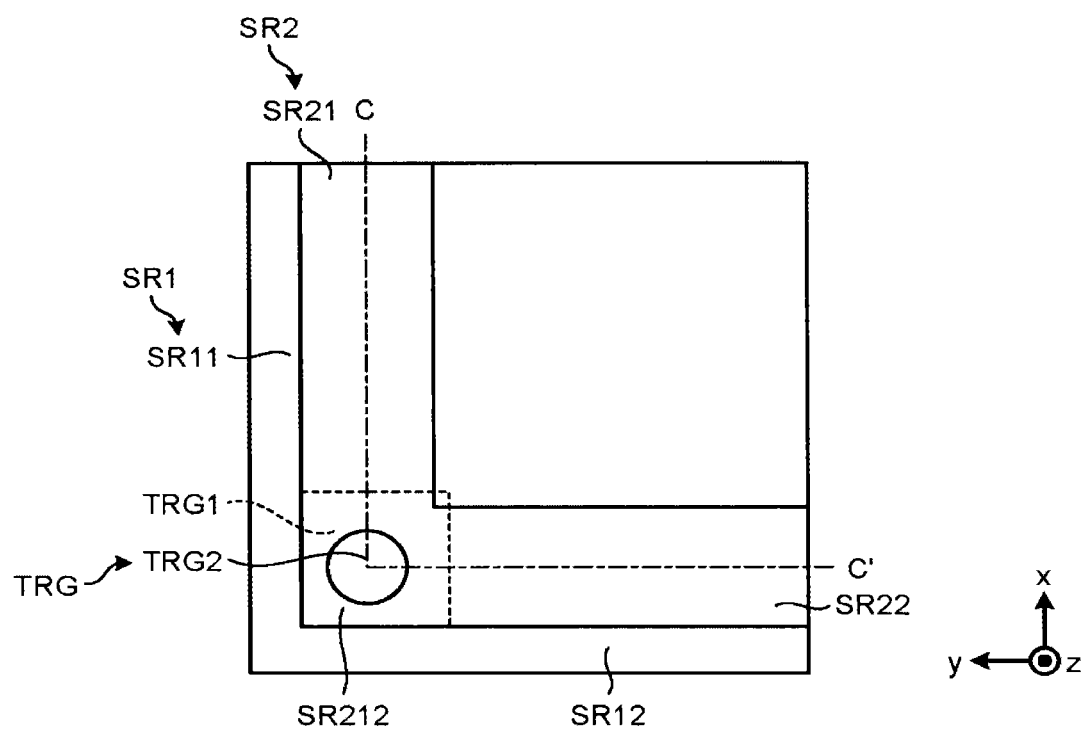
FIGS. 9A and 9B are diagrams illustrating the operation of the pixel in the first embodiment.
Figure 9B:
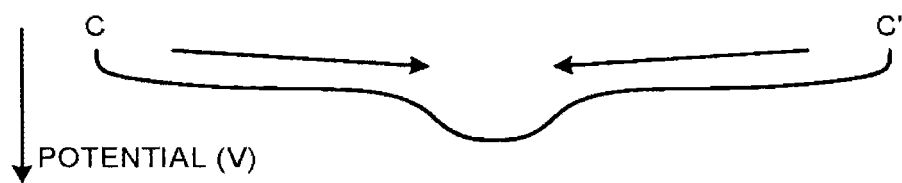

At this time, the trench portion TRG2 extends in the depth direction up to the vicinity of the semiconductor region SR2 from a position corresponding to the cross line CL1 (see FIG. 6B) on the front surface SBa of the semiconductor substrate SB (see FIG. 6A). As illustrated in FIG. 9A, in the semiconductor region SR2, a main part of the section SR21 and a main part of the section SR22 respectively have a flat shape in planar view while a connection section SR212 of the sections SR21 and SR22 includes a part having a long, diagonal distance from the semiconductor region SR1 to the semiconductor region SR4 in planar view. Consequently, as illustrated in FIG. 9B, in the semiconductor region SR2, the potential (depletion potential) of the connection section SR212 tends to be higher for the charge to be transferred than the main parts of the sections SR21 and SR22. Hence, the trench portion TRG2 is extended in the depth direction from the position corresponding to the cross line CL1 up to the vicinity of the semiconductor region SR2. Accordingly, charge can be taken out from a region where in the semiconductor region SR2 charge tends to be stored. FIG. 9A is a diagram illustrating the planar arrangement of the semiconductor region SR2. FIG. 9B is a diagram illustrating the distribution of the potential for charges along line C-C' of FIG. 9A.

The reset portion RST resets the voltage of the charge-voltage conversion portion FD. The reset portion RST is, for example, a reset transistor, resets the voltage of the charge-voltage conversion portion FD by being turned on when the control signal at the active level is supplied to a gate RSTG, and puts the charge-voltage conversion portion FD in an electrically floating state by being turned off when the control signal at the non-active level is supplied to the gate RSTG.

Moreover, the reset portion RST operates to put the pixel P in a selected/non-selected state. For example, when the vertical shift resistor 13 (see FIG. 3) controls a reset power supply RSD (see FIG. 22) to a first potential (for example, VDD), the reset portion RST resets the potential of the charge-voltage conversion portion FD to the first potential and accordingly puts the pixel P in the selected state. When the vertical shift resistor 13 controls the reset power supply RSD to a second potential (a potential at which the amplifying portion AMP is turned off, for example, GND), the reset portion RST may reset the potential of the charge-voltage conversion portion FD to the second potential and accordingly puts the pixel P in the non-selected state.

Figure 21:
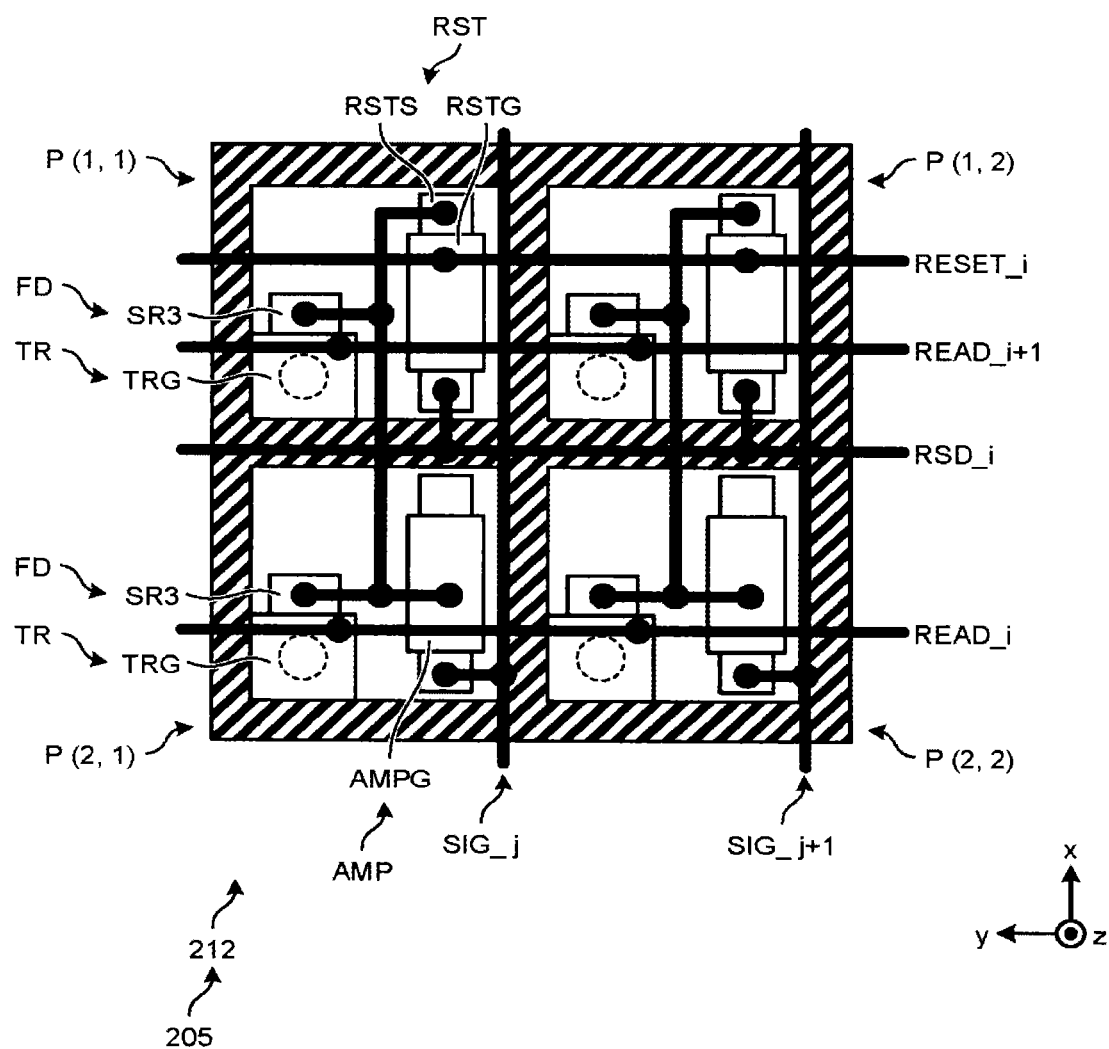
FIG. 21 is a diagram illustrating a configuration of a solid-state imaging device according to a second embodiment.

When the pixel P has entered the selected state, the amplifying portion AMP outputs a signal corresponding to the voltage of the charge-voltage conversion portion FD to a signal line SIG (for example, signal lines SIG_j and SIG_j+1 illustrated in FIG. 21). The amplifying portion AMP is, for example, an amplifier transistor, and is electrically connected at a gate AMPG to the charge-voltage conversion portion FD. Consequently, when the pixel P has entered the selected state, the amplifying portion AMP (amplifier transistor) performs a source follower operation in conjunction with a load current source (not illustrated) connected via the signal line SIG to output, to the signal line SIG, a signal corresponding to the voltage of the charge-voltage conversion portion FD.

Figure 10A:
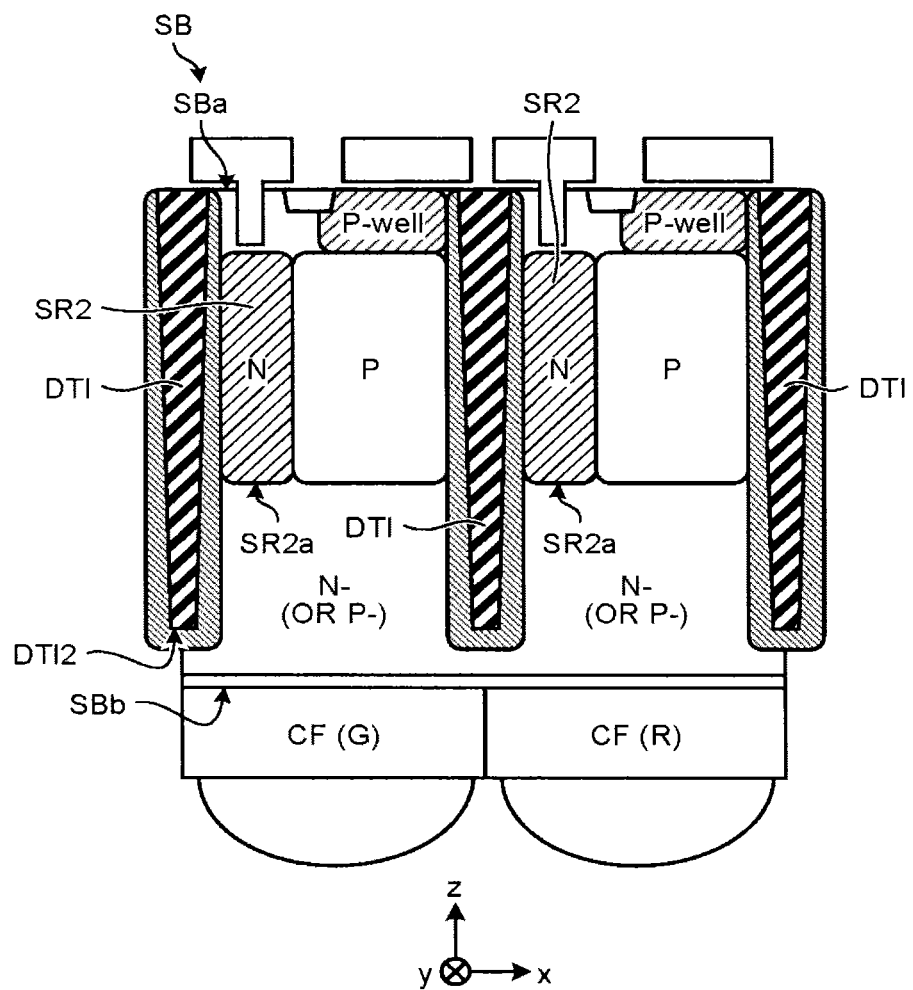
FIGS. 10A and 10B are diagrams illustrating other configuration examples of a element isolation portion in the first embodiment.
Figure 10B:
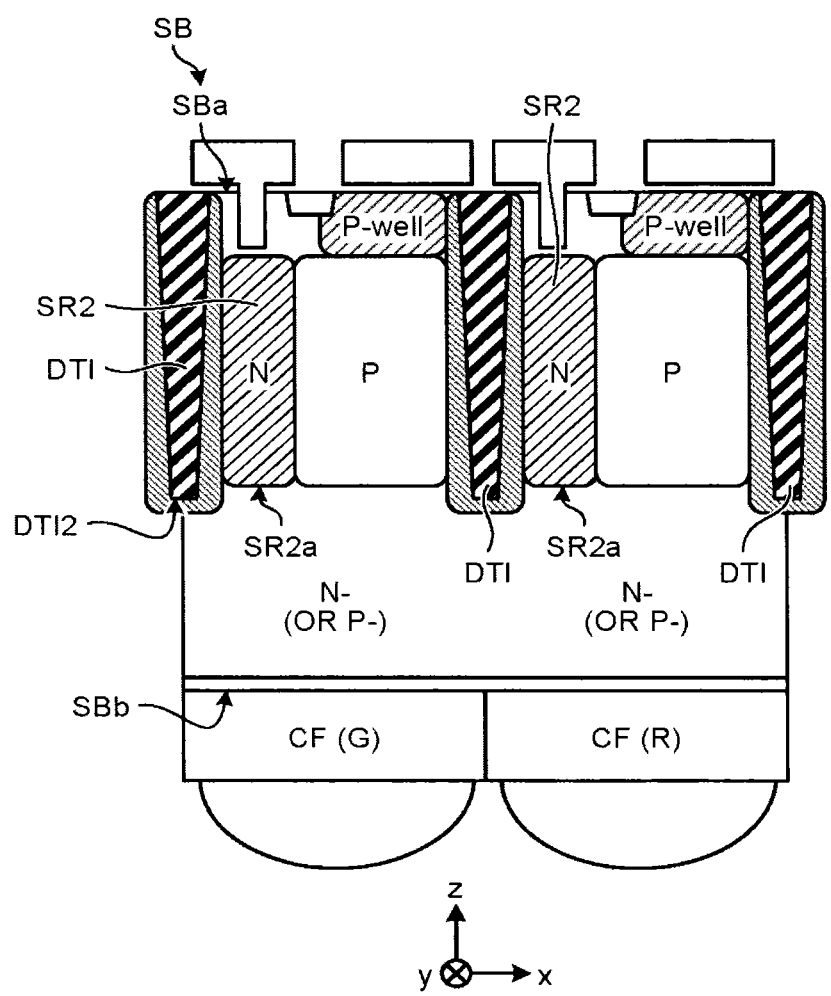

It should be noted that, in cross-sectional view, the element isolation portion DTI may extend in the depth direction in the semiconductor substrate SB from the front surface SBa of the semiconductor substrate SB to a shallower position than the back surface SBb. Also in this case, as illustrated in FIGS. 10A and 10B, as long as a lower end DTI2 of the element isolation portion DTI is located at least at a deeper position than a lower end SR2a of the semiconductor region SR2 of each pixel, the storage capacity of the signal storage portion PD can be increased. FIGS. 10A and 10B are diagrams illustrating other configuration examples of the element isolation portion DTI.

For example, in the case illustrated in FIG. 10A, the lower end DTI2 of the element isolation portion DTI is located at a depth between the lower end SR2a of the semiconductor region SR2 of each pixel and the back surface SBb of the semiconductor substrate SB. In the case illustrated in FIG. 10B, the lower end DTI2 of the element isolation portion DTI is located at a depth equal to the lower end SR2a of the semiconductor region SR2 of each pixel.

Figure 11:
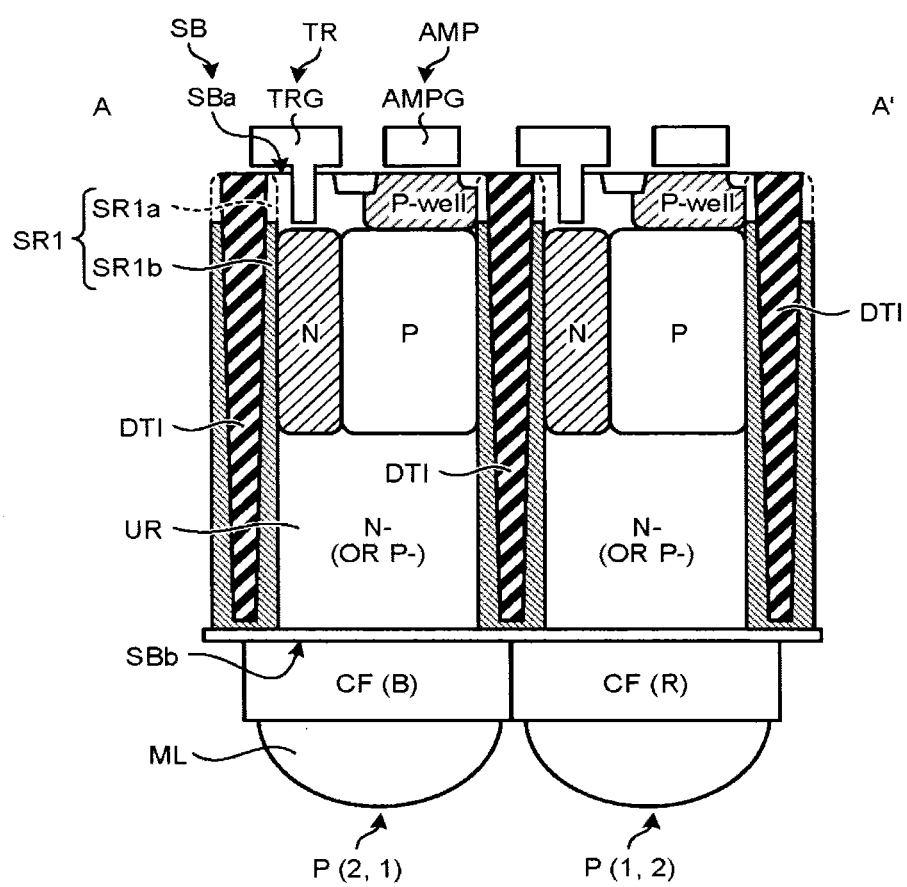
FIG. 11 is a diagram illustrating another configuration example of a semiconductor region formed on an outer peripheral portion of the element isolation portion in the first embodiment.

Moreover, as illustrated in FIG. 11, in the first conductive type semiconductor region SR1 (for example, a p-type region) of high concentration formed on an outer peripheral portion of the element isolation portion DTI, the impurity concentration of an uppermost end part of the element isolation portion DTI, that is, a part (first sectional region) SR1a in the vicinity of the front surface SBa may be lower than the impurity concentration of a part (second sectional region) SR1b in contact with the semiconductor region SR2, the part. SR1b being at a deeper position than the position of the part SR1a. In FIG. 11, while the part SR1a is not hatched and its boundary is indicated by a broken line, the part SR1b is hatched and its boundary is indicated by a solid line. Accordingly, it indicates a point that the impurity concentration of the part SR1a is lower than the impurity concentration of the part SR1b. For example, the impurity concentration of the part SR1a in the vicinity of the front surface SBa in the semiconductor region SR1 is desired to be at a concentration roughly equal to the impurity concentration of a F-well region provided in the vicinity of the front surface SBa. At this time, the semiconductor region SR1 is desired to be in electrical contact with the P-well region. If the pixel is made smaller, a source region and drain region of a read-out circuit, or the second conductive type semiconductor region SR3 of high concentration that is to be a charge-voltage conversion region, and the semiconductor region SR1 are close to each other. Therefore, a high electric field is applied between the second conductive type semiconductor region SR3 to which a high voltage is applied, and the semiconductor region SR1 to which a reference potential is applied, which may become a cause of noise in the dark due to the generation of hot carriers or the like (see FIGS. 4A and 4B).

Next, a method for manufacturing the solid-state imaging device 5 is explained with reference to FIGS. 12A to 14D. FIGS. 12A, 12B, 14A and 14C are process cross-sectional views illustrating the method for manufacturing the solid-state imaging device 5. FIGS. 13, 14B, and 14D are plan views illustrating the method for manufacturing the solid-state imaging device S. In FIGS. 12A to 14D, a manufacturing method in a case where the configuration of the element isolation portion DTI is the configuration illustrated in FIG. 10A is illustrated by example.

Figure 12A:
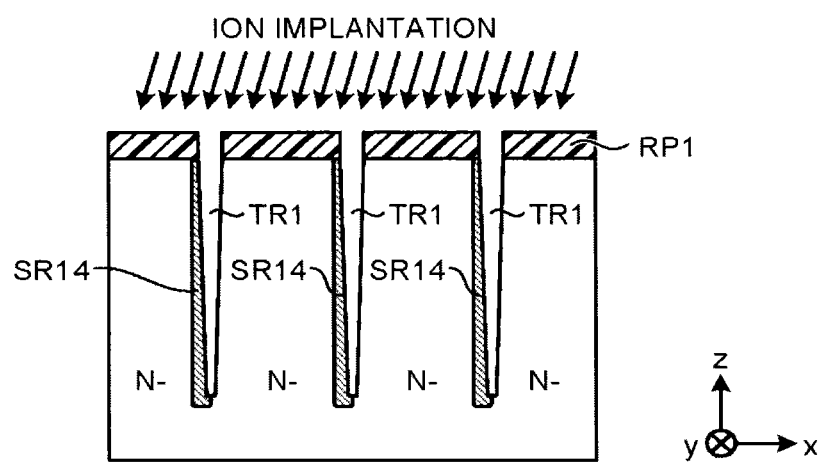
FIGS. 12A and 12B are diagrams illustrating a method for manufacturing the solid-state imaging device according to the first embodiment.
Figure 13:
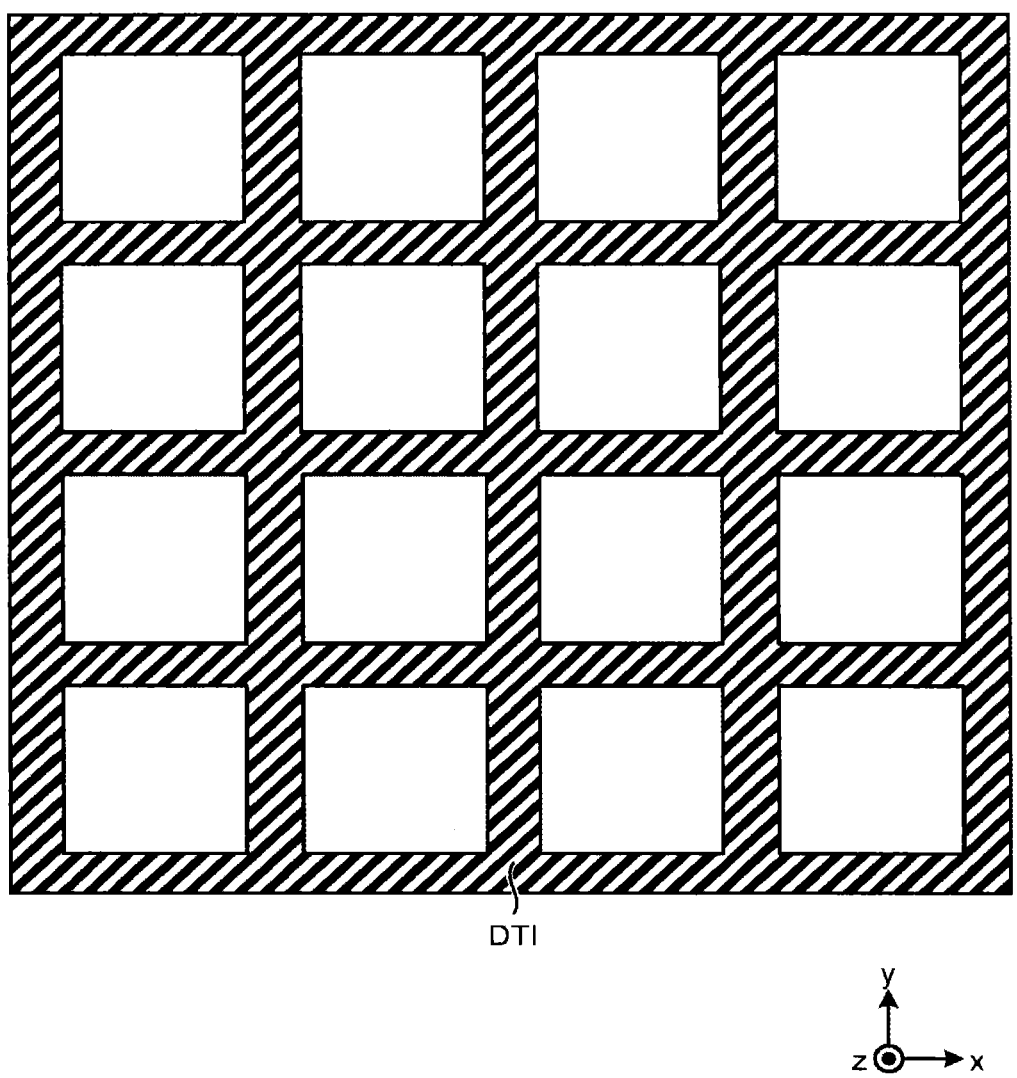
FIG. 13 is a diagram illustrating the method for manufacturing the solid-state imaging device according to the first embodiment.

In the process illustrated in FIG. 12A, the semiconductor substrate SB is prepared. In the semiconductor substrate SB, the second conductive type (for example, N-type) impurities are formed in a semiconductor (for example, silicon). The N-type impurities are, for example, phosphorous or arsenic. The part expressed by SB may be a semiconductor epitaxial layer formed on a silicon substrate, into which impurities are introduced in advance, instead of the semiconductor substrate SB.

A trench TR1 in which an insulating material is to be filled is formed in the semiconductor substrate SB. For example, a resist pattern RP1 where a part corresponding to the element isolation portion DTI is open is formed on the semiconductor substrate SB by lithography. The opening of the resist pattern RP1 corresponds to a region that is to be the element isolation portion DTI (see FIG. 13), and is formed in such a manner as to extend in a grid form in planar view. The semiconductor substrate SB is etched by RIP, using the resist pattern RP1 as a mask, to form the trench TR1. At this time, the etching time is adjusted such that the depth of the trench TR1 is a depth corresponding to the element isolation portion DTI (see FIG. 10A).

The first conductive type (for example, P-type) impurities are introduced in a side surface of the trench TRI by ion implantation, using the resist pattern RP1 as the mask. The P-type impurities are, for example, boron. At this time, the first conductive type impurity ions are implanted in the side surface of the trench TR1 at an angle slightly inclining toward the +x direction. Moreover, a larger implantation amount of the first conductive type impurity ions than an implantation amount in a later process is implanted in the side surface of the trench TR1. Consequently, the impurities are introduced in the side surface of the trench TR1 on the −x side (the surface that is to be a side wall of the element isolation portion DTI on the +x side) to form the section SR14 (see FIG. 6A) in the semiconductor region SR1.

Figure 12B:
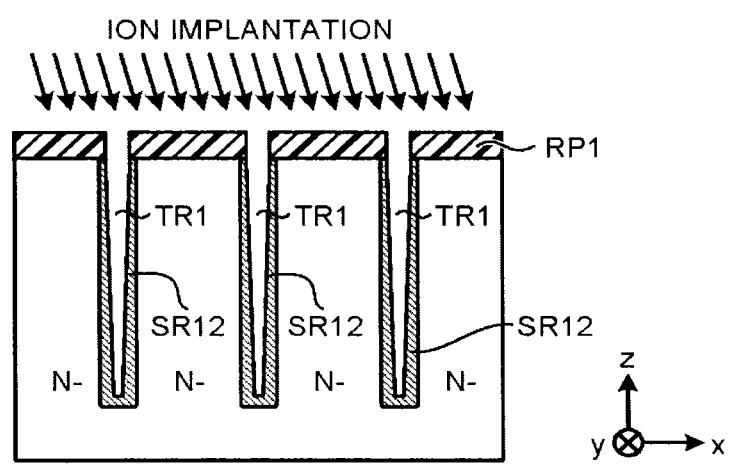

In the process illustrated in FIG. 12B, the first conductive type (for example, P-type) impurities are introduced in another side surface of the trench TR1 by ion implantation, using the resist pattern RP1 as the mask. In other words, the first conductive type impurity ions are implanted in the side surface of the trench TR1 at an angle slightly inclining toward the −x direction, using the resist pattern RP1 as the mask. Moreover, the larger implantation amount of the first conductive type impurity ions than the implantation amount in the later process is implanted in the side surface of the trench TR1. Consequently, the impurities are introduced in the side surface of the trench TR1 on the +x side (the surface that is to be a side wall of the element isolation portion DTI on the −x side) to form the section SR12 (see FIG. 6A) in the semiconductor region SR1.

Similarly, although not illustrated, the first conductive type impurity ions are implanted in a side surface of the trench TR1 at an angle slightly inclining toward the +y direction, using the resist pattern RP1 as the mask. Moreover, the larger implantation amount of the first conductive type impurity ions than the implantation amount in the later process is implanted in the side surface of the trench TR1. Consequently, the impurities are introduced in the side surface of the trench TR1 on the −y side (the surface that is to be a side wall of the element isolation portion DTI on the +y side) to form the section SR11 (see FIG. 6A) in the semiconductor region SR1.

The first conductive type impurity ions are implanted in a side surface of the trench TR1 at an angle slightly inclining toward the −y direction, using the resist pattern RP1 as the mask. Moreover, the larger implantation amount of the first conductive type impurity ions than the implantation amount in the later process is implanted in the side surface of the trench TR1. Consequently, the impurities are introduced in the side surface of the trench TRI on the +y side (the surface that is to be a side wall of the element isolation portion DTI on the −y side) to form the section SR13 (see FIG. 6A) in the semiconductor region SR1.

Consequently, the semiconductor region SR1 is formed in a substantially square tube shape (see FIG. 6B). The resist pattern RP1 is subsequently removed.

In the process illustrated in FIG. 13, an insulating material is filled in the trench TR1. The insulating material (for example, silicon oxide) is deposited over the entire surface, for example, by CVD. The insulating material is removed from the front surface SBa of the semiconductor substrate SB by CMP. The insulating material is selectively left in the trench TR1. Consequently, the element isolation portion DTI is formed in the semiconductor substrate SB. The pattern of the element isolation portion DTI corresponds to the pattern of the trench TR1 and extends in a grid form in planar view. The depth of the element isolation portion DTI is formed with a sufficient depth to electrically isolate a plurality of pixels. For example, the element isolation portion DTI is formed such that the lower end of the element isolation portion DTI is located deeper than the lower end of the semiconductor region SR2 that is to be formed in a later process (see FIGS. 8, 10A, and 10B).

Figure 14A:
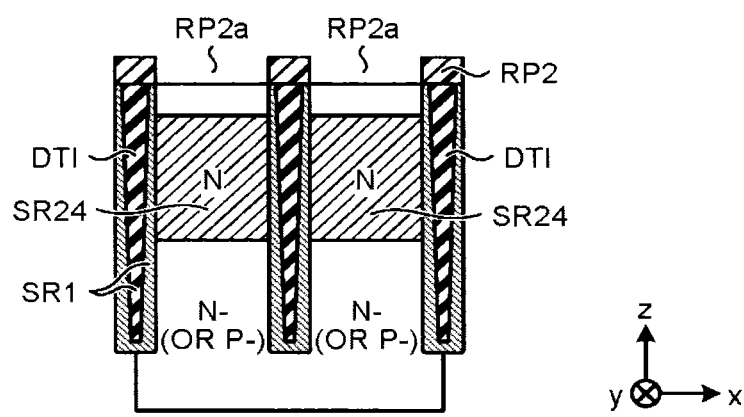
FIGS. 14A to 14D are diagrams illustrating the method for manufacturing the solid-state imaging device according to the first embodiment.
Figure 14B:
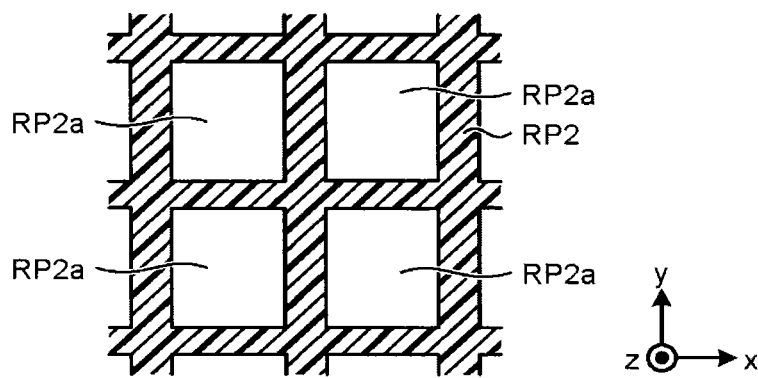

In the processes illustrated in FIGS. 14A and 14B, a resist pattern RP2 to selectively cover the element isolation portion DTI and the semiconductor region SR1 is formed. The resist pattern RP2 extends in a grid form in planar view. Moreover, the resist pattern RP2 includes an opening pattern RP2a corresponding to regions where the semiconductor regions SR2 and SR4 are to be formed. If the concentration of the first conductive type impurities in the semiconductor region SR4 is sufficiently higher than the concentration of the second conductive type impurities in the semiconductor region SR2, the resist pattern PR2 may be a pattern where the entire pixel array is open.

The second conductive type (for example, N-type) impurities are introduced in the semiconductor substrate SB by ion implantation, using the resist pattern RP2 as a mask. In other words, the second conductive type impurity ions are implanted in the semiconductor substrate SB, using the resist pattern RP2 as the mask. The N-type impurities are, for example, phosphorous or arsenic. At this time, a smaller implantation amount of the second conductive type impurity ions than the implantation amount in the processes illustrated in FIGS. 12A and 12B is implanted in the semiconductor substrate SB. Moreover, the second conductive type impurity ions are implanted in the semiconductor substrate SB at such an accelerating voltage (implantation energy) as to be implanted in a deeper position than the front surface SBa in the semiconductor substrate SB. Moreover, the semiconductor substrate SB may be doped by introducing impurities in a silicon substrate beforehand. Moreover, the semiconductor substrate SB may be a semiconductor epitaxial layer formed on the silicon substrate. In this case, doping may be performed by introducing impurities in the epitaxial layer beforehand.

Consequently, a semiconductor region SR24 (see FIG. 14A) arranged in the depth direction from a deeper position than the front surface SBa in the semiconductor substrate SB is formed. The resist pattern RP2 is subsequently removed.

Figure 14C:
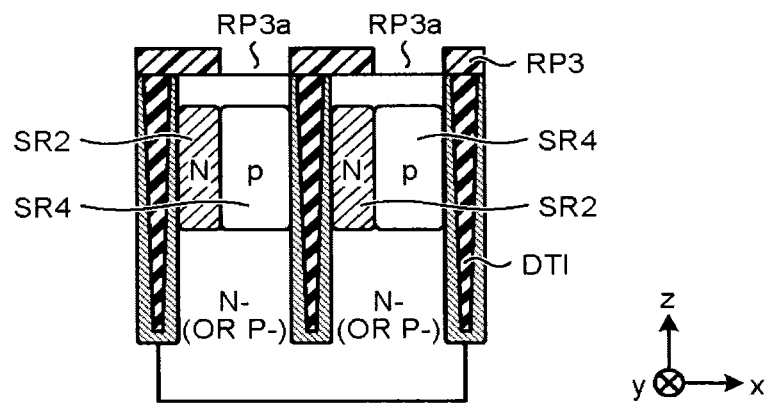
Figure 14D:
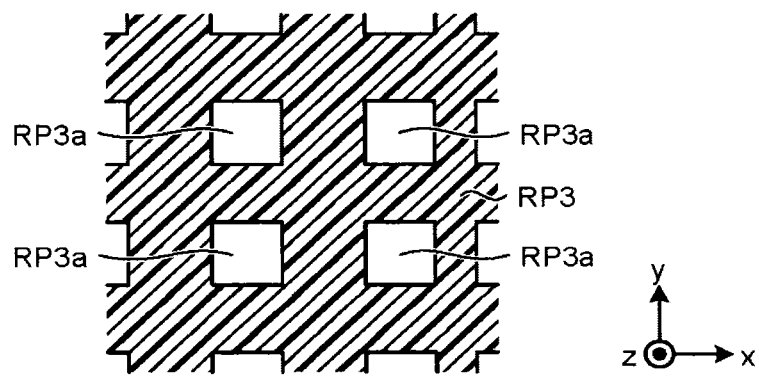

In the processes illustrated in FIGS. 14C and 14D, a resist pattern RP3 is formed which selectively covers a region that is to be the semiconductor region SR2 in addition to the element isolation portion DTI and the semiconductor region SR1. The resist pattern RP3 extends in a grid form in planar view. Moreover, the resist pattern RP3 includes an opening pattern RP3a corresponding to regions where the semiconductor regions SR4 are to be formed.

The first conductive type (for example, P-type) impurities are introduced in the semiconductor substrate SB by ion implantation, using the resist pattern RP3 as a mask. In other words, the first conductive type impurity ions are implanted in the semiconductor substrate SB, using the resist pattern RP3 as the mask. The P-type impurities are, for example, boron. At this time, a smaller implantation amount of the first conductive type impurity ions than the implantation amount in the processes illustrated in FIGS. 12A and 12B is implanted in the semiconductor substrate SB. Moreover, the first conductive type impurity ions are implanted in the semiconductor substrate SB at such an accelerating voltage (implantation energy) as to be implanted in a deeper position than the front surface SBa in the semiconductor substrate SB.

Consequently, the region where in the semiconductor region SR24 (see FIG. 14A) the first conductive type impurity ions have been implanted is formed as the semiconductor region SR4. The semiconductor region SR4 is a semiconductor region arranged in the depth direction from a deeper position than the front surface SBa in the semiconductor substrate SB. At the same time, a region where in the semiconductor region SR24 (see FIG. 14A) the first conductive type impurity ions have not been implanted is left as the semiconductor region SR2. The boundary of the semiconductor region SR2 is defined such that the semiconductor region SR2 is a semiconductor region arranged vertically in the depth direction from the deeper position than the front surface SBa in the semiconductor substrate SB.

As described above, in the first embodiment, the signal storage portion PD of each pixel P is configured to be of vertical type in the solid-state imaging device 5. In other words, in the signal storage portion PD of each pixel P, the semiconductor region SR1 is a first conductive type (for example, P-type) semiconductor region, and covers the side wall of the element isolation portion DTI on the signal storage portion PD side. The semiconductor region SR2 is a second conductive type (for example, N-type) semiconductor region, and is arranged vertically in the depth direction from the deeper position than the front surface SBa in the semiconductor substrate SB and extends along the semiconductor region SR1 in a vertical plate shape. Consequently, a P-N junction structure is formed between the semiconductor regions SR1 and SR2. The vicinity of the interface between the semiconductor regions SR1 and SR2 becomes a P-N junction interface.

At this time, the P-N junction interface extends in the depth direction. Accordingly, even if the area of each pixel P in the planar direction is made smaller, a large area of the P-N junction interface can be secured. Consequently, if the P-N junction structure is equivalently regarded as a capacitive element, the area of an electrode of the equivalent capacitive element can be secured, and the capacitance value of the P-N junction structure can be secured. Accordingly, it is possible to increase the amount of charge that can be stored in the signal storage portion PD of each pixel P and increase the number of saturation electrons.

Moreover, the semiconductor region SR2 extends in a vertical plate shape along the semiconductor region SR1. Accordingly, the width of the semiconductor region SR2 in the planar direction can be reduced. Consequently, if the P-N junction structure is equivalently regarded as a capacitive element, the space between the electrodes of the equivalent capacitive element can be reduced, and the capacitance value of the P-N junction structure can be secured. Accordingly, it is possible to increase the amount of charges that can be stored in the signal storage portion PD of each pixel P and increase the number of saturation electrons.

Therefore, if the area of each pixel in the planar direction is made smaller, the number of saturation electrons can be increased.

Moreover, in the first embodiment, the signal storage portion PD of each pixel P is arranged in the deeper position than the front surface of the semiconductor substrate SB in the solid-state imaging device 5. Consequently, if the area of each pixel in the planar direction is made smaller, large dimensions (=W/L, W: gate width and L: gate length) of the amplifying portion (amplifier transistor) AMP of each pixel P, the amplifying portion being arranged on the front surface of the semiconductor substrate SB, can be secured, and the increase of random noise can be suppressed.

Moreover, in the first embodiment, the semiconductor region SR1 extends along the square tube ST including the surface FC1 and the surface FC2 intersecting with the surface FC1 on the cross line CL1 in the signal storage portion PD of each pixel P. The semiconductor region SR2 includes the section SR21 extending in a plate shape along the surface FC1 up to the position corresponding to the cross line CL1, and the section SR22 extending in a plate shape along the surface FC2 from the position corresponding to the cross line CL1. Consequently, the semiconductor region SR2 can be formed as a semiconductor region that is arranged vertically in the depth direction from the deeper position than the front surface SBa in the semiconductor substrate SB and extends in a vertical plate shape along the semiconductor region SR1.

Moreover, in the first embodiment, in the signal storage portion PD of each pixel P, the trench gate TRG extends in the depth direction up to the vicinity of the semiconductor region SR2 from the position corresponding to the cross line CL on the surface Sba of the semiconductor substrate SB. Consequently, charges can be taken out from the region where in the semiconductor region SR2 charges tend to be stored. As a consequence, it is possible to prevent charges from being left out upon signal charge readout, and prevent the generation of an afterimage in an image in accordance with an image signal obtained by the solid-state imaging device 5.

Moreover, in the first embodiment, the transfer portion TR including the trench gate TRG is, for example, a vertical transfer transistor in the signal storage portion PD of each pixel P. In other words, the transfer portion TR has, as a source region, the semiconductor region SR2 arranged in the deeper position than the front surface SBa in the semiconductor substrate SB, and has, as a drain region, the charge-voltage conversion portion FD (the semiconductor region SR3) arranged in the vicinity of the front surface SBa in the semiconductor substrate SB. Consequently, the transfer portion TR transfers the charge taken out from the semiconductor region SR2 vertically to the charge-voltage conversion portion ED (the semiconductor region SR3). Also from this point of view, if the area of each pixel in the planar direction is made smaller, large dimensions of the amplifying portion (amplifier transistor) AMP of each pixel P, the amplifying portion being arranged on the front surface of the semiconductor substrate SB, can be secured, and the increase of random noise can be suppressed.

Moreover, there is the element isolation portion DTI of the DTI structure formed by digging a trench, in a boundary portion between pixels. The element isolation portion DTI penetrates from the front surface SBa to the back surface SBb. Accordingly, photoelectrons generated by incident light can be effectively prevented from diffusing to an adjacent pixel. Therefore, a playback image at a low degree of color mixing and with excellent color reproducibility can be obtained. Moreover, an insulating material having a lower refractive index than a refractive index of a semiconductor such as silicon, for example, a silicon oxide film or a silicon nitride film, is filled in the element isolation portion DTI. Accordingly, a light incident on a pixel at a fixed angle or smaller can be reflected from the surface of the element isolation portion DTI. Hence, it is possible to reduce the degree of color mixing occurring by the incident light leaking into an adjacent pixel. Therefore, it is possible to obtain a playback image with excellent color reproducibility. In order to obtain a similar effect, not only an insulating material but also a metal material may be filled in the element isolation portion DTI.

It should be noted that, in the method for manufacturing the solid-state imaging device 5, the method for introducing impurities to a semiconductor region is not limited to ion implantation, but another method can be used.

For example, if solid phase diffusion is used instead of ion implantation, the processes illustrated in FIGS. 15A to 15D are performed instead of the processes illustrated in FIGS. 12A and 12B. In the process illustrated in FIG. 15A, as in the process illustrated in FIG. 12A, the trench TRI is formed in the semiconductor substrate SB to form the resist pattern RP1 on the semiconductor substrate SB. In the process illustrated in FIG. 15E, a film 31 containing the first conductive type (for example, P-type) impurities is filled in the trench TRI by CVD. For example, a BSG film (boron-doped silicate glass film) is deposited as the film 31 over the entire surface by CVD. In the process illustrated in FIG. 15C, the semiconductor substrate SB is heated to diffuse the first conductive type impurities contained in the film 31 to the side surfaces of the trench TRI. Consequently, the semiconductor region SR1 is formed to a substantially square tube shape (see FIG. 6B). The resist pattern RP1 is subsequently removed. In the process illustrated in FIG. 15D, as in the process illustrated in FIG. 13, an insulating material is filled in the trench TRI to form the element isolation portion DTI.

Figure 15A:
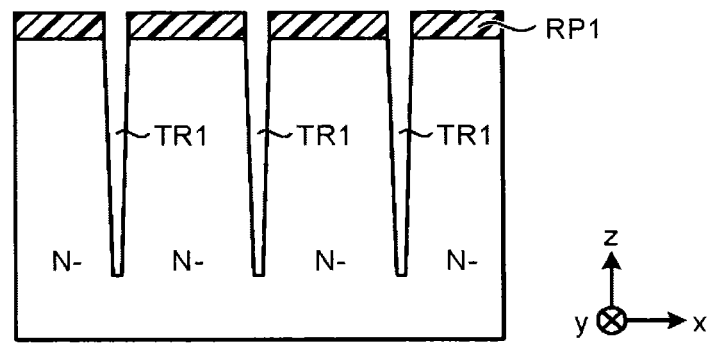
FIGS. 15A to 15D are diagrams illustrating a method for manufacturing a solid-state imaging device according to a modification of the first embodiment.
Figure 15B:
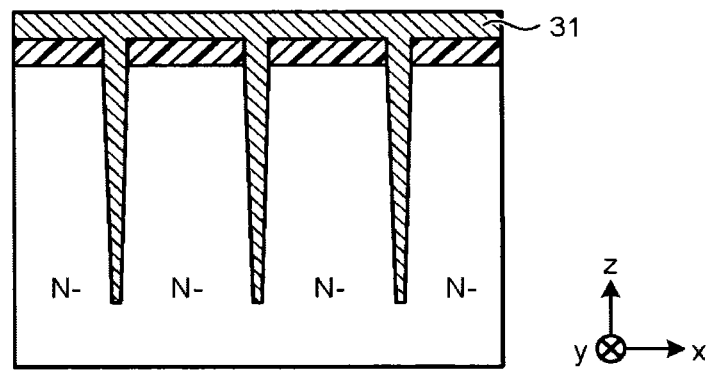
Figure 15C:
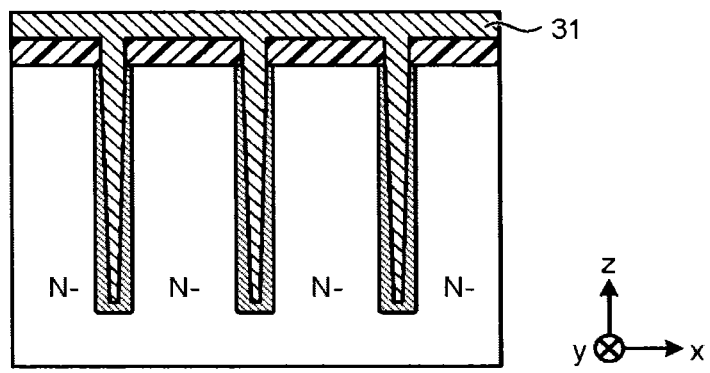
Figure 15D:
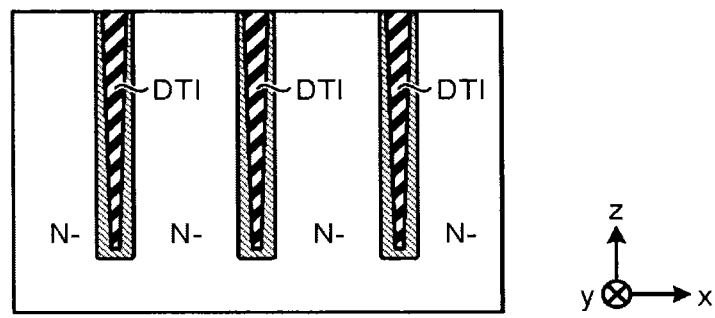

For example, if vapor phase diffusion is used instead of ion implantation, the processes illustrated in FIGS. 15A and 15D are performed instead of the processes illustrated in FIGS. 12A and 12B. In the process illustrated in FIG. 15A, as in the process illustrated in FIG. 12A, the trench TRI is formed in the semiconductor substrate SB to form the resist pattern RP1 on the semiconductor substrate SB. Impurity gas containing the first conductive type (for example, P-type) impurities is supplied to the semiconductor substrate SB. In this state, the semiconductor substrate SB is heated to diffuse the first conductive type impurities contained in the impurity gas to the side surfaces of the trench TR1. Consequently, the semiconductor region SR1 is formed to a substantially square tube shape (see FIG. 6B). The resist pattern RP1 is subsequently removed. In the process illustrated in FIG. 15D, as in the process illustrated in FIG. 13, an insulating material is filled in the trench TR1 to form the element isolation portion DTI. Moreover, a method is also acceptable in which an atmosphere is put in a plasma state to dope impurities in a state where the side walls of the device isolation DTI are exposed.

Figure 16A:
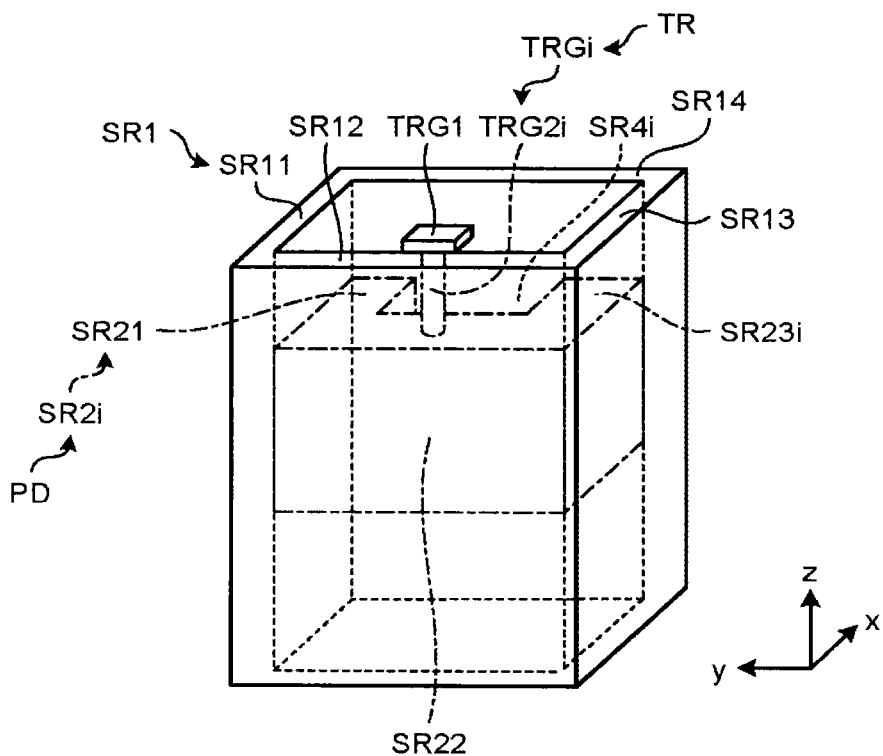
FIGS. 16A and 16B are diagrams illustrating a configuration of a pixel in another modification of the first embodiment.
Figure 16B:
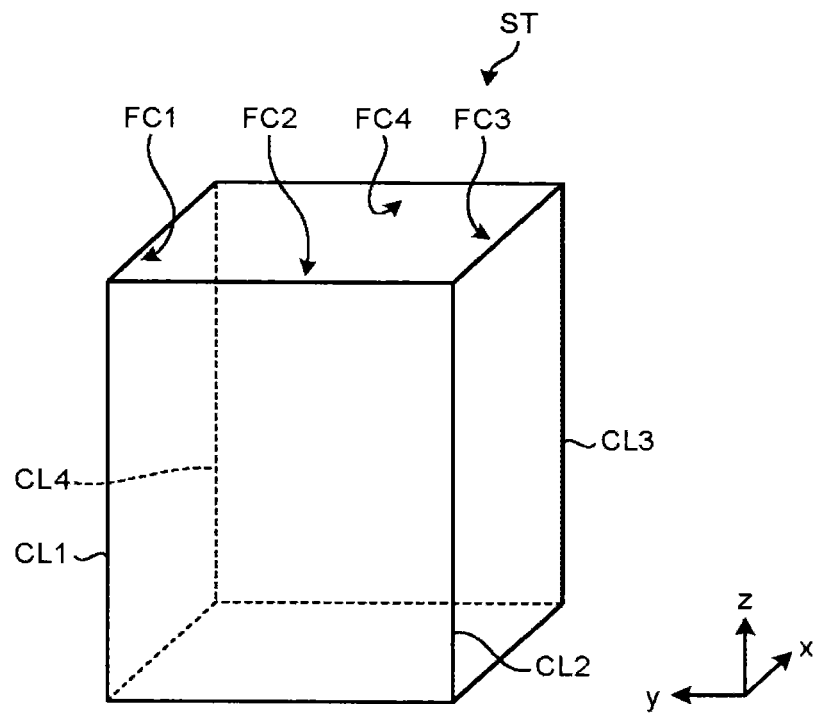

Alternatively, a semiconductor region SR2$i$ may be configured as illustrated in FIGS. 16A and 16B instead of FIGS. 6A and 6B. FIG. 16A is a transparent perspective view illustrating a part of the configuration of the pixel P. FIG. 16B is a perspective view illustrating a virtual square tube corresponding to the configuration of the pixel P.

Specifically, in the signal storage portion PD, the semiconductor region SR2$i$ includes a section (third section) SR23$i$ in addition to the section (first section) SR21 and the section (second section) SR22 as illustrated in FIG. 16A. The section SR23$i$ extends along the section SR13 of the semiconductor region SR1. The section SR23$i$ extends along the surface FC3 from a position corresponding to the cross line CL2 up to a position corresponding to the cross line CL3. The semiconductor region SR2$i$ has a substantially U-shape when seen through from the direction perpendicular to the front surface SBa of the semiconductor substrate SB. A semiconductor region SR4$i$ is arranged in a depth position corresponding to (for example, equal to) the semiconductor region SR2$i$ in the semiconductor substrate SB in such a manner as to fill a space surrounded by the sections SR21, SR22, and SR23$i$ of the semiconductor region SR2$i$ and the sections SR13 and SR14 of the semiconductor region SR1. Also with such a configuration, the semiconductor region SR2$i$ can be formed as a semiconductor region that is arranged vertically in the depth direction from the deeper position than the front surface SBa in the semiconductor substrate SB and extends in a vertical plate shape along the semiconductor region SR1.

Figure 17A:
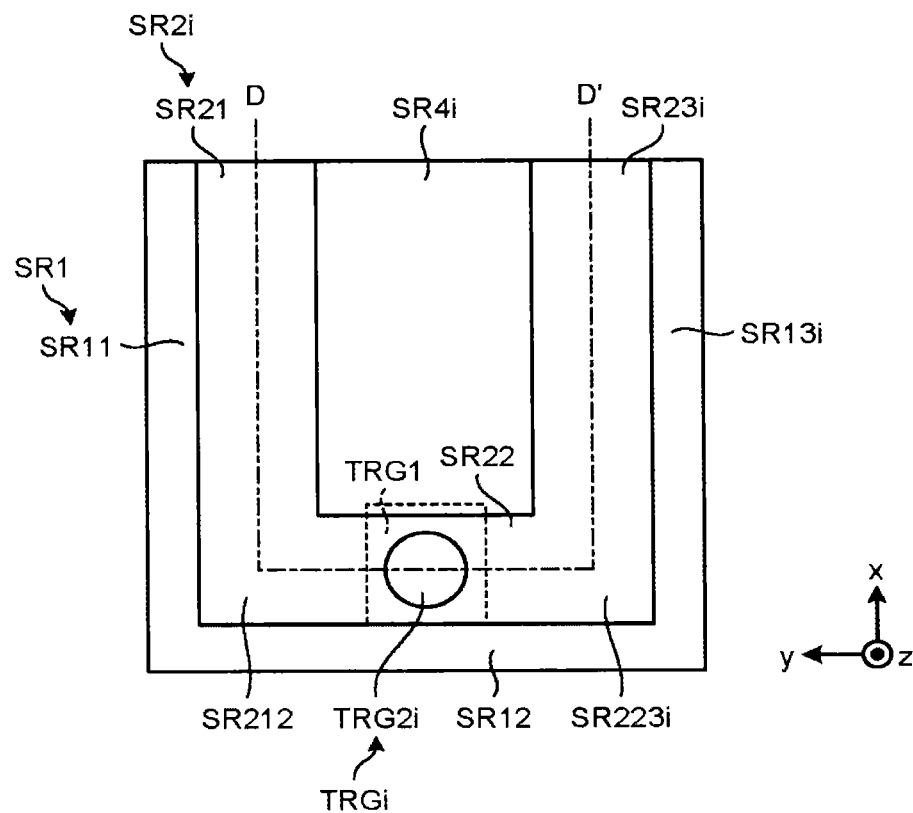
FIGS. 17A and 17B are diagrams illustrating the operation of the pixel in the other modification of the first embodiment.
Figure 17B:
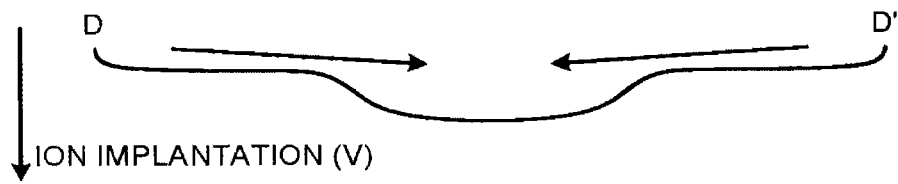

At this time, a trench portion TRG2$i$ of a trench gate TRG$i$ extends in the depth direction up to the vicinity of the semiconductor region SR2$i$ from a position corresponding to a space (see FIG. 16B) between the cross lines CL1 and CL2 on the front surface SBa of the semiconductor substrate SB (see FIG. 16A). In the semiconductor region SR2$i$, each of the main part of the section SR21, the main part of the section SR22, and a main part of the section SR23$i$ has a flat shape in planar view as illustrated in FIG. 17A. Each of the connection section SR212 of the sections SR21 and SR22 and a connection section SR233$i$ of the sections SR22 and SR23$i$ within the semiconductor region SR2$i$ includes a part having a long, diagonal distance between the semiconductor region SR1 and the semiconductor region SR4$i$ in planar view. Consequently, as illustrated in FIG. 17B, in the semiconductor region SR2$i$, the potentials of the connection sections SR212 and SR233$i$ tend to be higher for the charges to be transferred than the main parts of the sections SR21, SR22, and SR23$i$ in the plan view of FIG. 17A. Furthermore, the impurity concentration of the section SR22 is made higher by a certain degree than the impurity concentrations of the sections SR21 and SR23$i$.

Accordingly, as illustrated in FIG. 17B, the potential of the section SR22 can be easily made higher than the potentials of the sections SR212 and SR223i. Hence, the trench portion TRG2i is extended in the depth direction from a position corresponding to a space between the cross lines CL1 and CL2 up to the vicinity of the semiconductor region SR2i. Accordingly, charge can be taken out from a region where in the semiconductor region SR2i charge tends to be stored. FIG. 17A is a diagram illustrating the planar arrangement of the semiconductor region SR2i. FIG. 17B is a diagram illustrating the distribution of the potential for charges along line D-D' of FIG. 17A.

Figure 18A:
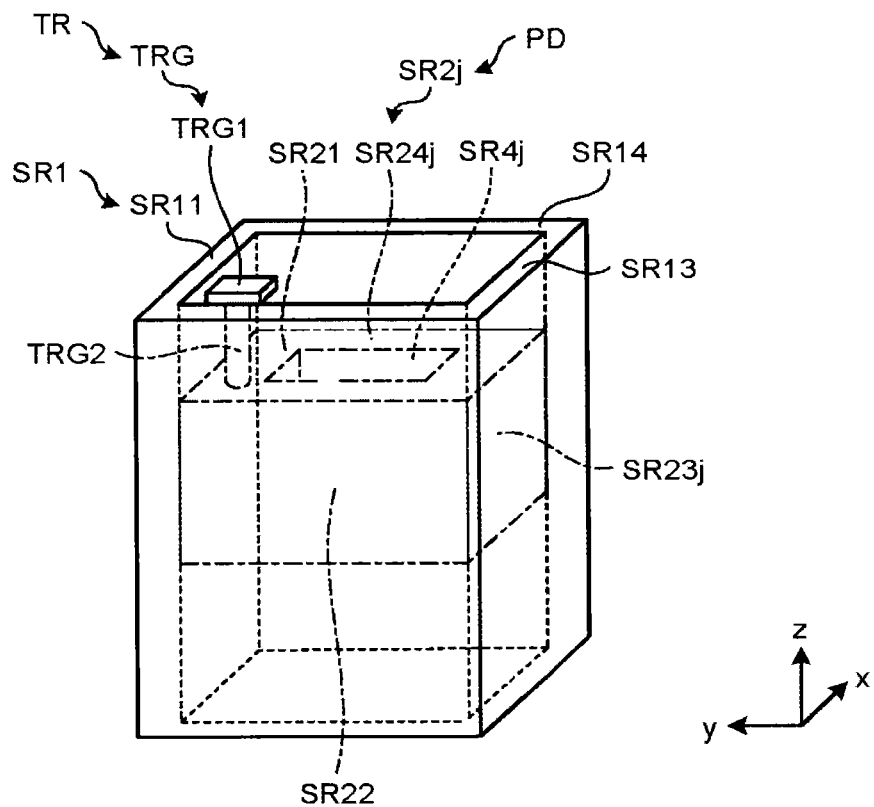
FIGS. 18A and 18B are diagrams illustrating a configuration of a pixel in another modification of the first embodiment.
Figure 18B:
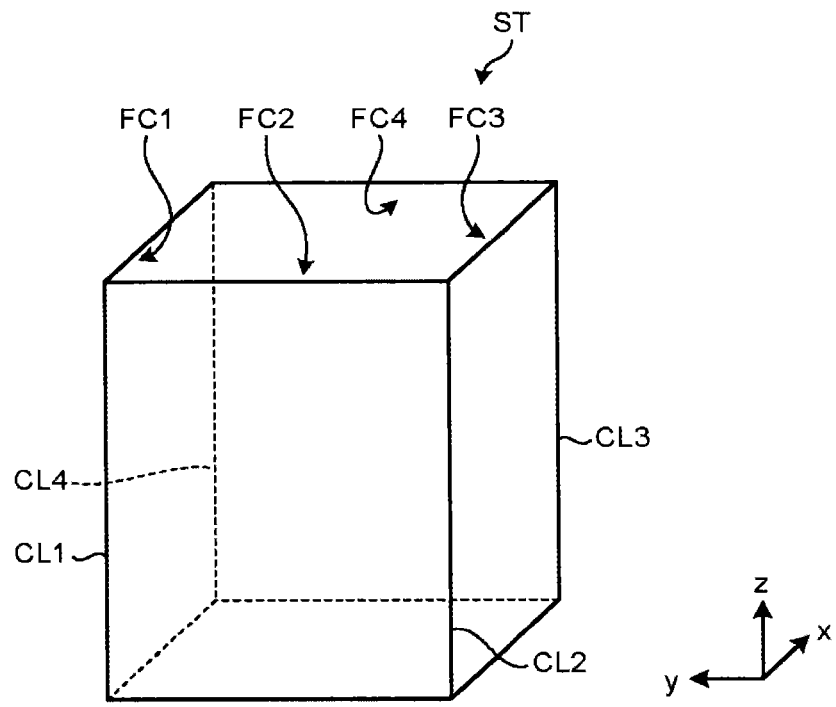

Alternatively, a semiconductor region SR2j may be configured as illustrated in FIGS. 18A and 18B, instead of FIGS. 6A and 6B. FIG. 18A is a transparent perspective view illustrating a part of the configuration of the pixel P. FIG. 18B is a perspective view illustrating a virtual square tube corresponding to the configuration of the pixel P.

Specifically, as illustrated in FIG. 18A, the semiconductor region SR2j includes a section (third section) SR23j and a section (fourth section) SR24j in addition to the section (first section) SR21 and the section (second section) SR22 in the signal storage portion PD. The section SR23j extends along the section SR13 of the semiconductor region SR1. The section SR23j extends along the surface FC3 from a position corresponding to the cross line CL2 up to a position corresponding to the cross line CL3. The section SR24j extends along the section SR14 of the semiconductor region SR1. The section SR24j extends along the surface FC4 from the position corresponding to the cross line CL3 up to a position corresponding to the cross line CL4. The semiconductor region SR2j has a substantially O-shape when seen through from the direction perpendicular to the front surface SBa of the semiconductor substrate SB. A semiconductor region SR4j is arranged in a depth position corresponding to (for example, equal to) the semiconductor region SR2j in the semiconductor substrate SB in such a manner as to fill a space surrounded by the sections SR21, SR22, SR23j, and SR24j of the semiconductor region SR2i. Also with such a configuration, the semiconductor region SR2j can be formed as a semiconductor region that is arranged vertically in the depth direction from a deeper position than the front surface SBa in the semiconductor substrate SB and extends in a vertical plate shape along the semiconductor region SR1.

Moreover, the semiconductor region SR2j can be formed such that the concentration of the second conductive type impurities in each of the sections SR23j and SR24j is lower than the concentration of the second conductive type impurities in each of the sections SR21 and SR22. The configuration can be realized by adding a process of selectively introducing the second conductive type impurities to regions corresponding to the sections SR23j and SR24j, after the processes illustrated in FIGS. 14C and 14D.

For example, a resist pattern RP4 (not illustrated) is formed which selectively covers regions that are to be the sections SR21 and SR22, and the semiconductor region SR4j in addition to the element isolation portion DTI and the semiconductor region SR1. The resist pattern RP4 extends in a grid form in planar view. Moreover, the resist pattern RP4 includes an opening pattern RP4a (not illustrated) corresponding to regions where the sections SR23j and SR24j are to be formed.

The second conductive type (for example, N-type) impurities are introduced in the semiconductor substrate SB by ion implantation, using the resist pattern RP4 as a mask. In other words, the second conductive type impurity ions are implanted in the semiconductor substrate SB, using the resist pattern RP4 as the mask. The N-type impurities are, for example, phosphorous or arsenic. At this time, a smaller implantation amount of the second conductive type impurity ions than the implantation amount in the processes illustrated in FIGS. 14A and 14B is implanted in the semiconductor substrate SB. Moreover, the second conductive type impurity ions are implanted in the semiconductor substrate SB at such an accelerating voltage (implantation energy) as to be implanted in a deeper position than the front surface SBa in the semiconductor substrate SB. Consequently, the regions where the second conductive type impurity ions have been implanted in the semiconductor region SR4j are formed as the sections SR23j and SR24j. The concentration of the second conductive type impurities in each of the sections SR23j and SR24j is lower than the concentration of the second conductive type impurities in each of the sections SR21 and SR22.

Figure 19A:
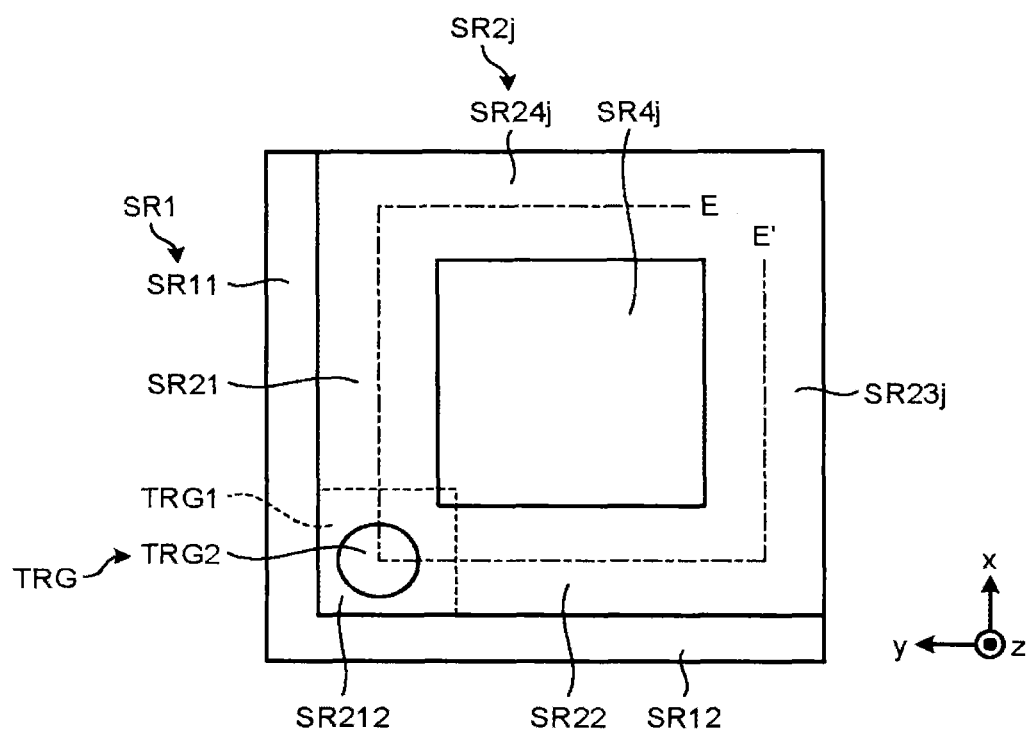
FIGS. 19A and 19B are diagrams illustrating the operation of the pixel in the other modification of the first embodiment.
Figure 19B:
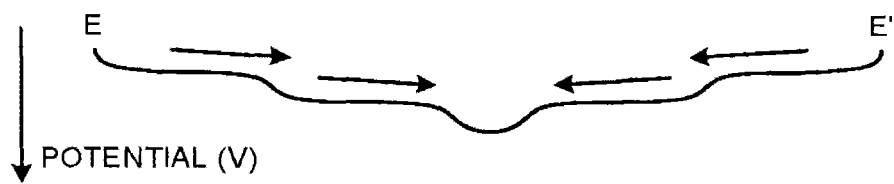

At this time, the trench portion TRG2 extends in the depth direction up to the vicinity of the semiconductor region SR2 from a position corresponding to the cross line CL1 (see FIG. 18D) on the front surface SBa of the semiconductor substrate SB (see FIG. 18A). In the semiconductor region SR2j, the concentration of the second conductive type impurities in each of the sections SR23j and SR24j is lower than the concentration of the second conductive type impurities in each of the sections SR21 and SR22. Consequently, as illustrated in FIG. 19E, in the semiconductor region SR2j, the potentials of the sections SR21 and SR22 tend to be higher for the charge to be transferred than those of the sections SR23j and SR24j. Moreover, as illustrated in FIG. 19A, in the semiconductor region SR2j, each of the main part of the section SR21 and the main part of the section SR22 has a flat shape in planar view while the connection section SR212 of the sections SR21 and SR22 includes a part having a long, diagonal distance between the semiconductor region SR1 and the semiconductor region SR4j in planar view. Consequently, as illustrated in FIG. 19B, in the semiconductor region SR2j, the potential of the connection section SR212 tends to be higher for the charge to be transferred than the main parts of the sections SR21 and SR22. In other words, in the semiconductor region SR2j, the potential tends to increase in stages in the order of the sections SR23j and SR24j, the main parts of the sections SR21 and SR22, and the connection section SR212. Hence, the charge stored in the semiconductor region SR2j can be easily directed to the vicinity of the connection section SR212 within the semiconductor region SR2j. Moreover, the trench portion TRG2 is extended in the depth direction from the position corresponding to the cross line CL1 up to the vicinity of the semiconductor region SR2. Accordingly, charges can be taken out efficiently from a region where in the semiconductor region SR2j charges tend to be stored. FIG. 19A is a diagram illustrating the planar arrangement of the semiconductor region SR2. FIG. 19B is a diagram illustrating the distribution of the potential for charges along line F-E' of FIG. 19A.

Figure 20A:
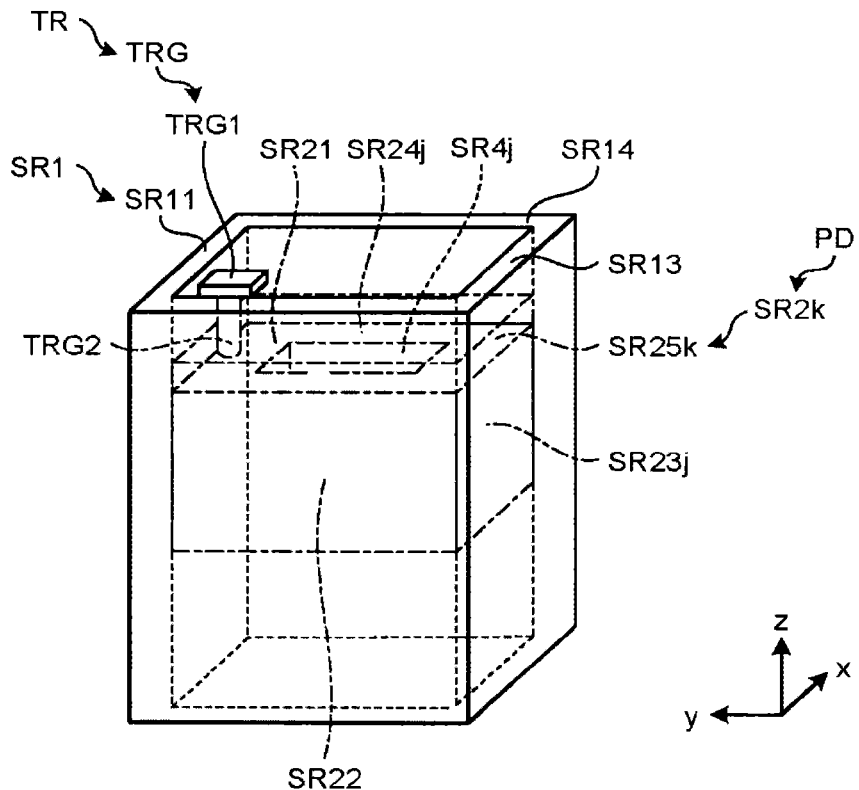
FIGS. 20A and 20B are diagrams illustrating a configuration of a pixel in another modification of the first embodiment.
Figure 20B:
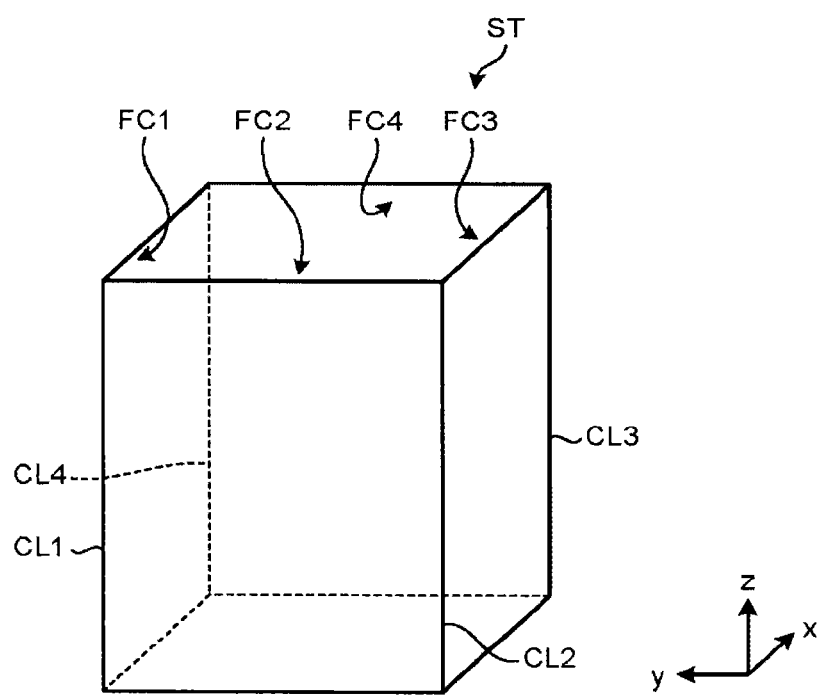

Alternatively, a semiconductor region SR2k may be configured as illustrated in FIGS. 20A and 20B instead of the configuration illustrated in FIGS. 18A and 18B. FIG. 20A is a transparent perspective view illustrating a part of the configuration of the pixel P. FIG. 20B is a perspective view illustrating a virtual square tube corresponding to the configuration of the pixel P.

In the configuration of FIGS. 20A and 20B, a section SR25k is added to the configuration of FIGS. 18A and 18B. The section SR25k covers ends of the sections SR21, SR22, SR23j, and SR24j on the front surface SBa side. The sections SR21, SR22, SR23j, and SR24j have a substantially O-shape when seen through from the direction perpendicular to the front surface SBa of the semiconductor substrate SB. The sections SR22, SR25k, and SR24j have a substantially reverse U-shape in a cross sectional view perpendicular to a direction from the surface FC1 to the surface FC3.

Moreover, the section SR25k covers an end of the semiconductor region SR4j on the front surface SBa side. In other words, the semiconductor region SR4j defines the boundary of the section SR25k such that the section SR25k is formed to a horizontal plate shape.

At this time, the concentration of the first conductive type impurities in the section SR25k can be made lower than the concentration of the first conductive type impurities in each of the sections SR21, SR22, SR23, and SR24. Consequently, in the semiconductor region SR2k, the potential can be increased in stages in the order of the sections SR23j and SR24j, the main parts of the sections SR21 and SR22, the connection section SR212, and the section SR25k.

With the configuration illustrated in FIGS. 20A and 20B, the areas of the regions to store signal charges (the vertical areas of the sections SR21, SR22, SR23j, and SR24j and the planar area of the section SR25k) can be further enlarged compared with the configuration of FIGS. 18A and 18B. Consequently, the amount of saturation charges (for example, the number of saturation electrons) of the signal storage portion PD can be further increased.

(Second Embodiment)

Next, a solid-state imaging device 205 according to a second embodiment is explained. An explanation is given below focusing on parts different from the first embodiment.

In the first embodiment, each pixel P includes the transfer portion TR, the reset portion RST, and the amplifying portion AMP. Accordingly, as illustrated in FIG. 4A, the width Wx in the x direction and the width Wy in the y direction of each pixel P need to be ensured for the placement of the transfer portion TR, the reset portion RST, and the amplifying portion AMP. For example, in planar view, it is required to ensure an area corresponding to the trench gate TRG of the transfer portion TR (transfer transistor), the gate RSTG of the reset portion RST (reset transistor), and the gate AMPG of the amplifying portion AMP (amplifier transistor), on a pixel P basis.

In contrast, if the number of elements (the number of transistors) to be placed for each pixel P can be reduced, the width Wx in the x direction and the width Wy in the y direction of each pixel P can be further reduced, and a further reduction in the size of each pixel P can be expected.

Hence, in the second embodiment, a plurality of pixels P share the reset portion RST and the amplifying portion AMP, and the reset portion RST and the amplifying portion AMP are distributed and placed in the plurality of pixels P.

Specifically, as illustrated in FIG. 21, two pixels adjacent in the column direction (x direction) in a pixel array 212 of the solid-state imaging device 205 share the reset portion RST and the amplifying portion AMP, and the reset portion RST and the amplifying portion AMP are distributed and placed in the two pixels adjacent in the column direction (x direction). FIG. 21 is a diagram illustrating the planar arrangement of the pixel array 212 of the solid-state imaging device 205 taking an example of a two-row by two-column array of pixels P(1, 1) to P(2, 2).

For example, two pixels P(1, 1) and P(2, 1) adjacent in the column direction (x direction) are explained by example. Two pixels P(2, 1) and P(2, 2) adjacent in the column direction (x direction) are also similar to the two pixels P(1, 1) and P(2, 1) adjacent in the column direction (x direction).

The pixel P(1, 1) includes the reset portion RST but does not include the amplifying portion AMP. A source RSTS of the reset portion RST (reset transistor) of the pixel P(1, 1) is electrically connected to each of the charge-voltage conversion portion FD (the semiconductor region SR3) of the pixel P(1, 1) and the charge-voltage conversion portion ED (the semiconductor region RS3) of the pixel 8(2, 1). Consequently, the reset portion RST of the pixel P(1, 1) resets the voltage of the charge-voltage conversion portion FD (the semiconductor region SR3) of the pixel P(1, 1), and resets the voltage of the charge-voltage conversion portion FD (the semiconductor region SR3) of the pixel P(2, 1).

Moreover, the pixel P(2, 1) includes the amplifying portion AMP but does not include the reset portion RST. The gate AMPG of the amplifying portion AMP (amplifier transistor) of the pixel P(2, 1) is electrically connected to each of the charge-voltage conversion portion ED (the semiconductor region SR3) of the pixel P(1, 1) and the charge-voltage conversion portion FD (the semiconductor region RS3) of the pixel P(2, 1). Consequently, the amplifying portion AMP of the pixel P(2, 1) outputs a signal corresponding to the voltage of the charge-voltage conversion portion FD (the semiconductor region SR3) of the pixel P(1, 1) to the signal line SIG_j, and outputs a signal corresponding to the voltage of the charge-voltage conversion portion ED (the semiconductor region SR3) of the pixel P(2, 1) to the signal line SIG_j.

Figure 22:
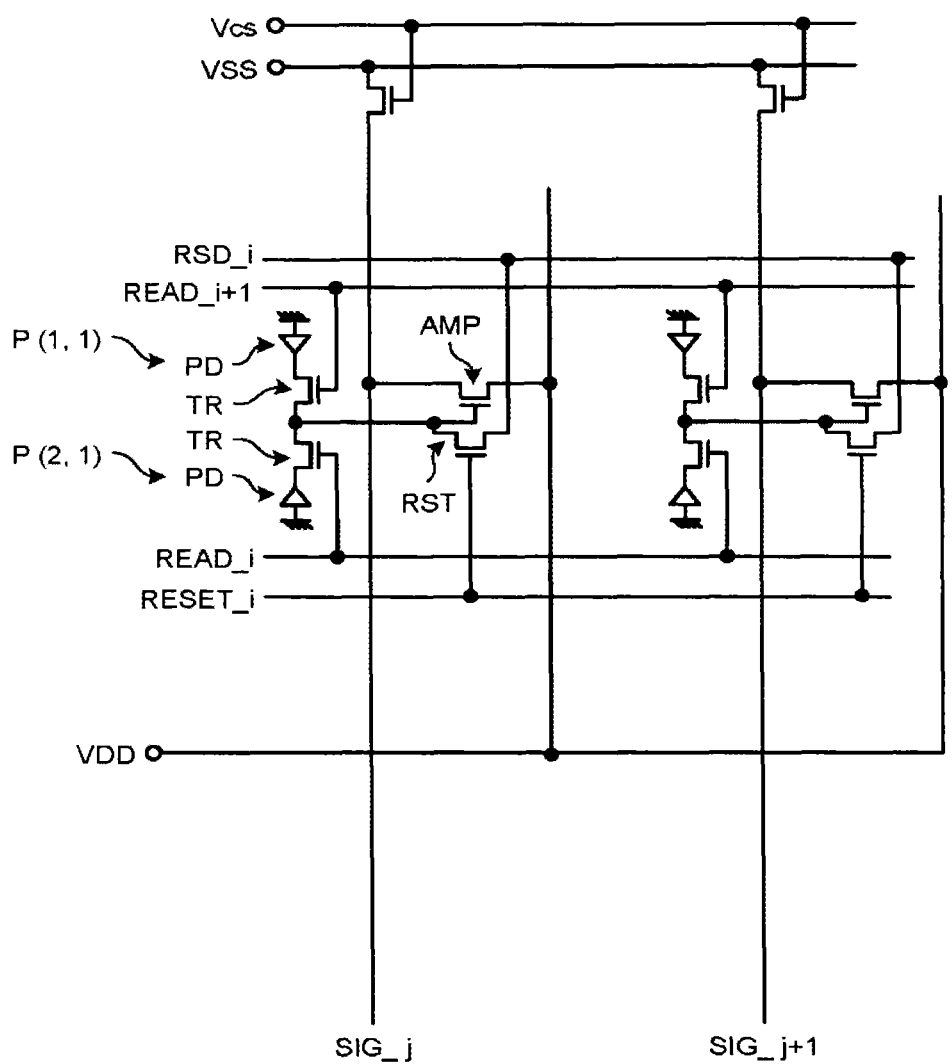
FIG. 22 is a diagram illustrating the configuration of the solid-state imaging device according to the second embodiment.

It should be noted that a circuit configuration corresponding to the planar arrangement illustrated in FIG. 21 is, for example, as illustrated in FIG. 22. FIG. 22 is a diagram illustrating the circuit configuration of the solid-state imaging device 205. Whether the two pixels P(1, 1) and P(2, 1) sharing the reset portion RST and the amplifying portion AMP output signals corresponding to the charges of the signal storage portions PD separately or add the signals and output them can be adjusted by the timing of ON/OFF of the transfer portions TR of the two pixels P(1, 1) and P(2, 1). The charge-voltage conversion portion ED (the semiconductor region SR3) of the pixel P(1, 1) and the charge-voltage conversion portion FD (the semiconductor region SR3) of the pixel P(2, 1) on the layout configuration illustrated in FIG. 21 are electrically connected to each other by a wire and have substantially the same voltage. Accordingly, as illustrated in FIG. 22, the charge-voltage conversion portions FD function as a single charge-voltage conversion element shared between the pixels P(1, 1) and P(2, 1) from a circuit configuration viewpoint.

As described above, in the second embodiment, in the pixel array 212 of the solid-state imaging device 205, a plurality of pixels P shares the reset portion RST and the amplifying portion AMP, and the reset portion RST and the amplifying portion AMP are distributed and placed in the plurality of sharing pixels P. Consequently, the number of elements (the number of transistors) to be placed for each pixel P can be reduced. As a consequence, the width Wx in the x direction and the width Wy in the y direction of each pixel P can be further reduced. Accordingly, each pixel P can be made still smaller. Moreover, if the area of each pixel in the planar direction is made smaller, large dimensions of the amplifying portion (amplifier transistor) AMP, the dimensions having been averaged for each pixel P, can be secured, and the increase of random noise can be suppressed.

Figure 23:
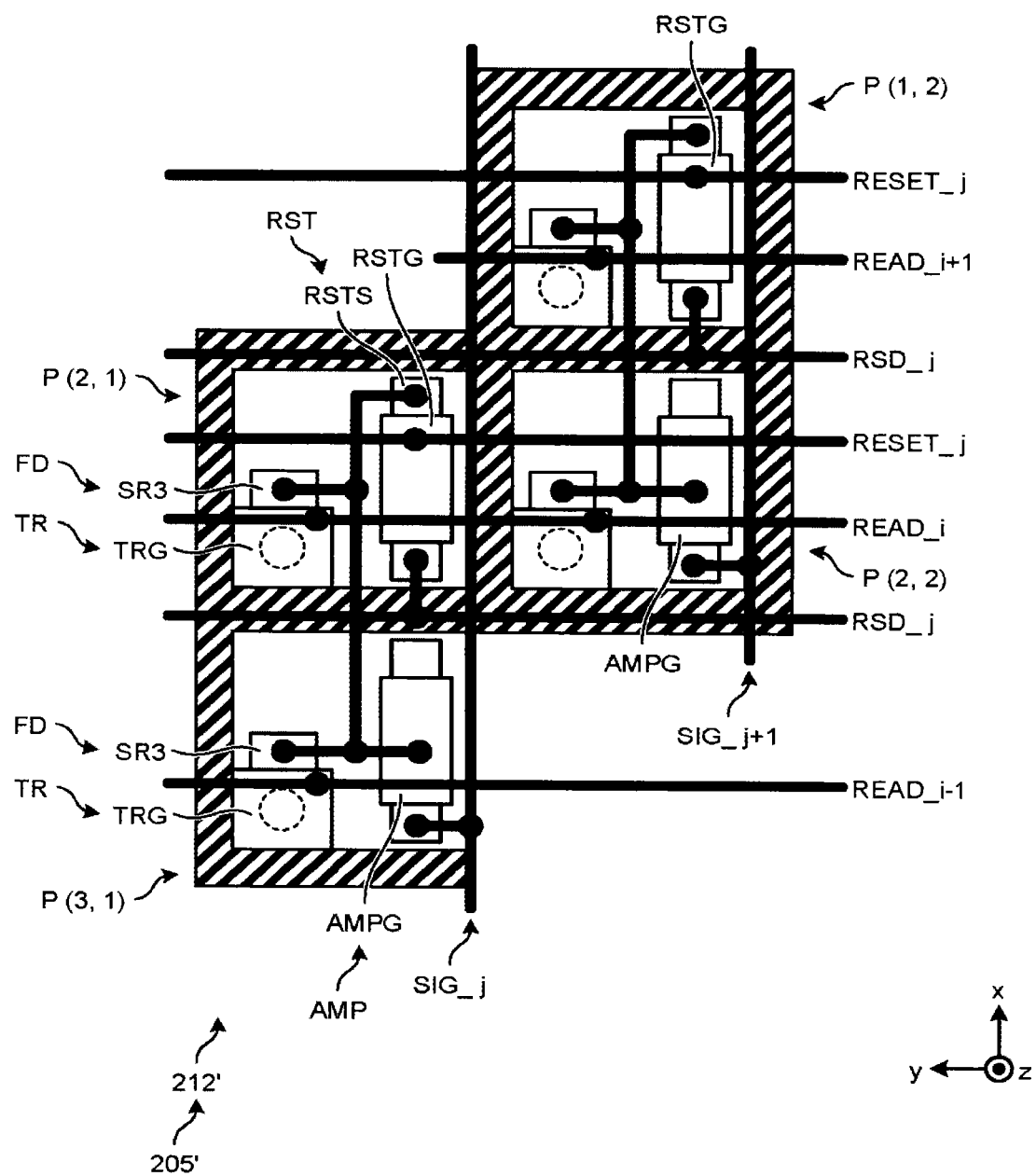
FIG. 23 is a diagram illustrating another configuration of the solid-state imaging device according to the second embodiment.

It should be noted that a pixel array 212' of a solid-state imaging device 205' may have such an arrangement as illustrated in FIG. 23 in a signal read-out circuit sharing configuration based on two pixels in the row direction and one column in the column direction. FIG. 23 is a diagram illustrating an example of another planar arrangement of the pixel array 212'. In other words, there is nothing changed in that the signal read-out circuit sharing unit is two pixels in the row direction and one column in the column direction. However, the arrangement may be one where the columns are staggered by one pixel in the up and down direction when looking at FIG. 23. For example, in the first column, the pixels P(2, 1) and P(3, 1) share the reset portion RST and the amplifying portion AMP, and the reset portion RST and the amplifying portion AMP are distributed and placed in the plurality of pixels P. In the second column, the pixels P(1, 2) and P(2, 2) share the reset portion RST and the amplifying portion AMP, and the reset portion RST and the amplifying portion AMP are distributed and placed in the plurality of pixels P. Also in this case, the number of elements (the number of transistors) to be placed for each pixel P can be reduced.

Alternatively, in the second embodiment, the explanation has been given by example where two pixels P adjacent in the column direction (x direction) share the reset portion RST and the amplifying portion AMP. However, the number of pixels that share the reset portion RST and the amplifying portion AMP may be three or more.

Figure 24:
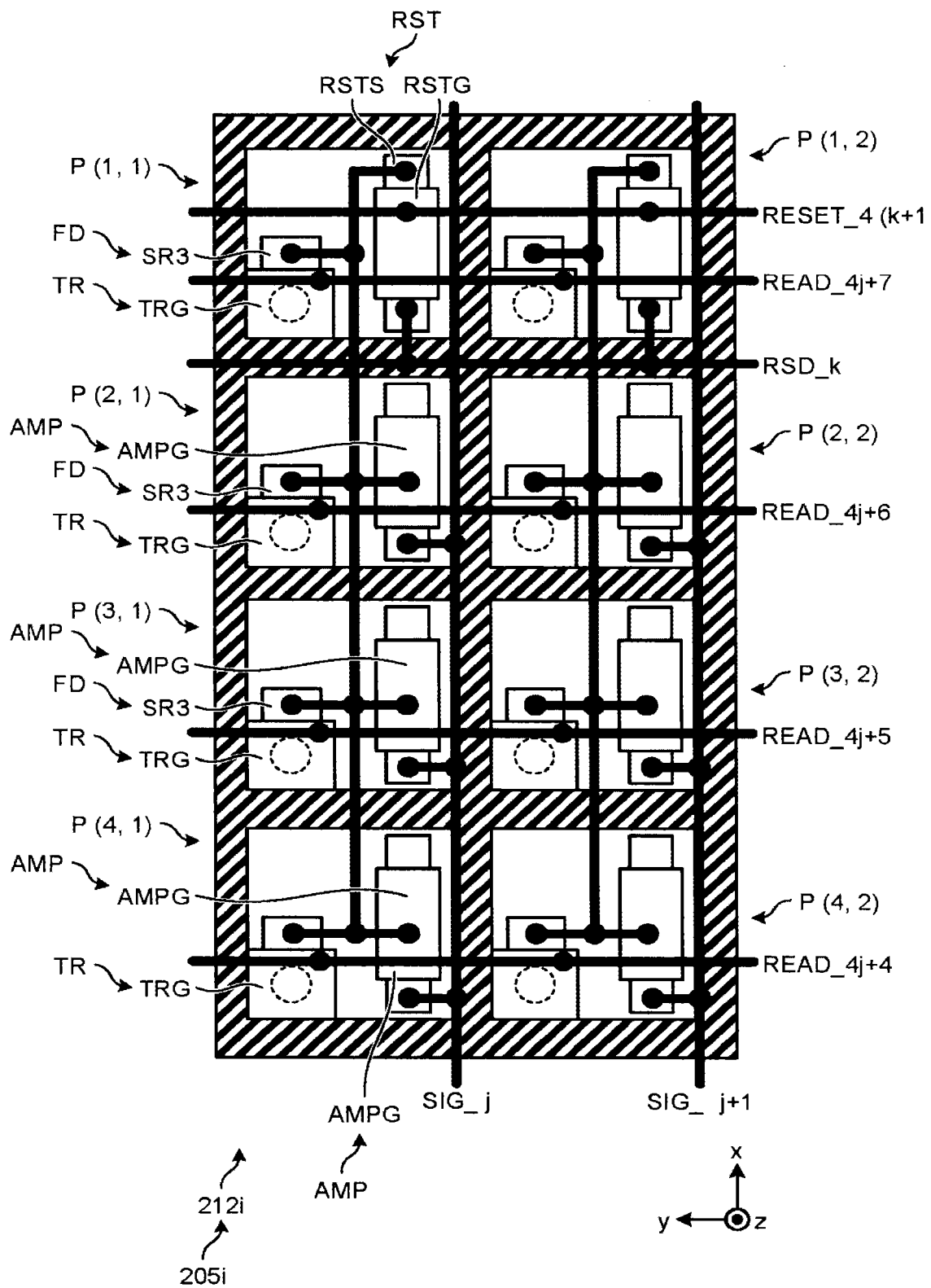
FIG. 24 is a diagram illustrating a configuration of a solid-state imaging device according to a modification of the second embodiment.

For example, as illustrated in FIG. 24, four pixels adjacent in the column direction (x direction) in a pixel array 212i of a solid-state imaging device 205i share the reset portion RST and the amplifying portions AMP, and the reset portion RST and the amplifying portions AMP are distributed and placed in the four pixels adjacent in the column direction (x direction). FIG. 24 is a diagram illustrating the planar arrangement of the pixel array 212i of the solid-state imaging device 205i taking an example of a four-row by two-column array of pixels P(1, 1) to P(4, 2).

For example, an explanation is given taking an example of four pixels P(1, 1), P(2, 1), P(3, 1), and P(4, 1) adjacent in the column direction (x direction). Four pixels P(1, 2), P(2, 2), P(3, 2), and P(4, 2) adjacent in the column direction (x direction) are also similar to the four pixels P(1, 1), P(2, 1), P(3, 1), and P(4, 1) adjacent in the column direction (x direction).

The pixel P(1, 1) includes the reset portion RST but does not include the amplifying portion AMP. The source RSTS of the reset portion RST (reset transistor) of the pixel P(1, 1) is electrically connected to each of the charge-voltage conversion portion FD (the semiconductor region SR3) of the pixel P(1, 1), the charge-voltage conversion portion FD (the semiconductor region RS3) of the pixel P(2, 1), the charge-voltage conversion portion FD (the semiconductor region SR3) of the pixel P(3, 1), and the charge-voltage conversion portion FD (the semiconductor region SR3) of the pixel P(4, 1). Consequently, the reset portion RST of the pixel P(1, 1) resets the voltage of the charge-voltage conversion portion FD (the semiconductor region SR3) of the pixel P(1, 1), resets the voltage of the charge-voltage conversion portion ED (the semiconductor regions SR3) of the pixel P(2, 1), resets the voltage of the charge-voltage conversion portion FD (the semiconductor regions SR3) of the pixel P(3, 1), and resets the voltage of the charge-voltage conversion portion FD (the semiconductor regions SR3) of the pixel P(4, 1).

Moreover, each of the pixels P(2, 1), P(3, 1), and P(4, 1) includes the amplifying portion AMP but does not include the reset portion RST. The gate AMPG of the amplifying portion AMP (amplifier transistor) of each of the pixels (2, 1), P(3, 1), and P(4, 1) is electrically connected to each of the charge-voltage conversion portion FD (the semiconductor region SR3) of the pixel P(1, 1), the charge-voltage conversion portion ED (the semiconductor region SR3) of the pixel P(2, 1), the charge-voltage conversion portion FD (the semiconductor region SR3) of the pixel P(3, 1), and the charge-voltage conversion portion FD (the semiconductor region SR3) of the pixel P(4, 1). Consequently, the amplifying portions AMP of the pixels P(2, 1), P(3, 1), and P(4, 1) are in a state of being connected in parallel with their respective sources shared and their respective drains shared. The sources of the amplifying portions AMP (amplifier transistors) of the pixels P(2, 1), P(3, 1), and P(4, 1) are connected via the signal line SIG_j, and their drains are connected via a power supply line. The charge-voltage conversion portions FD of the pixels P(1, 1), P(2, 1), P(3, 1), and P(4, 1) are always electrically connected to the gates AMPG of the amplifying portions AMP (amplifier transistors) of the pixels P(2, 1), (3, 1), and P(4, 1), and the source RSTS of the reset portion RST (reset transistor) of the pixel P(1, 1). In other words, the amplifying portions AMP of the pixels P(2, 1), P(3, 1), and P(4, 1) are connected in parallel between the charge-voltage conversion portions FD of the pixels P(1, 1), P(2, 1), P(3, 1), and P(4, 1), and the signal line SIG_j. Accordingly, the transconductance can easily be given.

Figure 25:
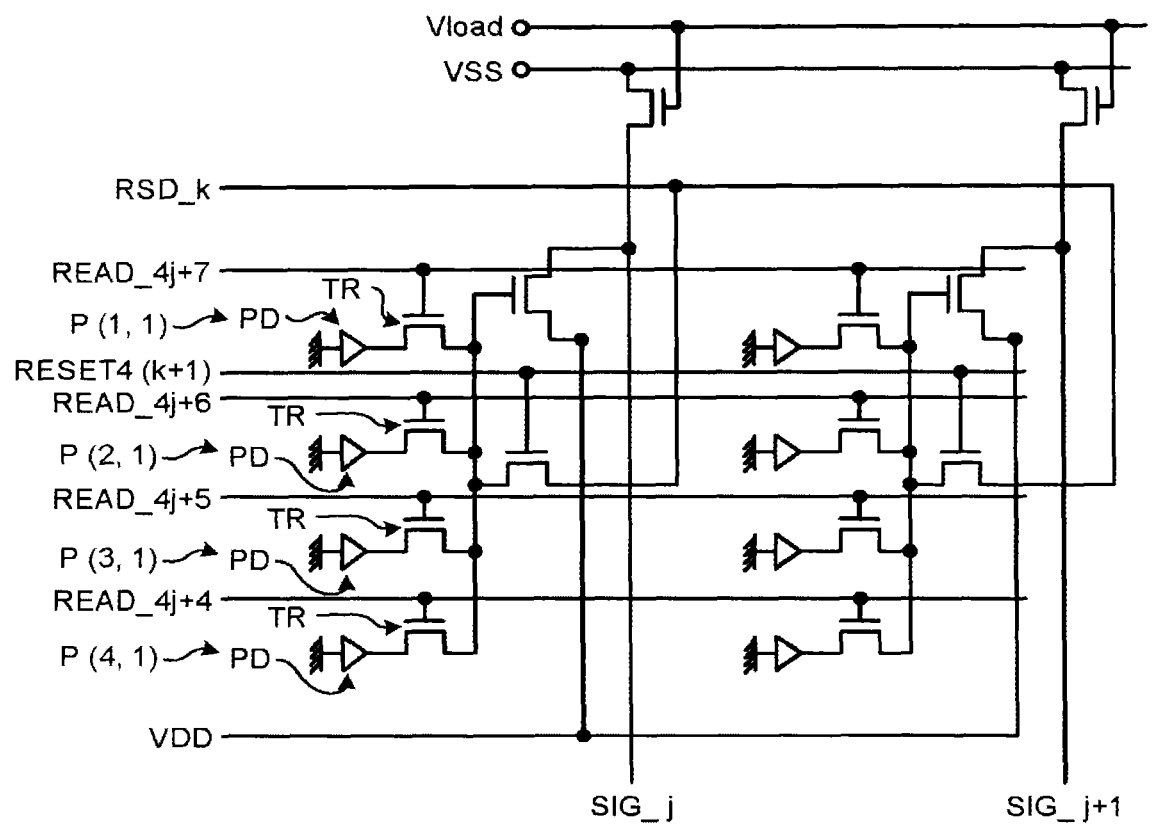
FIG. 25 is a diagram illustrating the configuration of the solid-state imaging device according to the modification of the second embodiment.

A circuit configuration corresponding to the planar arrangement illustrated in FIG. 24 is, for example, as illustrated in FIG. 25. FIG. 25 is a diagram illustrating the circuit configuration of the solid-state imaging device 205i. As illustrated in FIG. 25, the amplifying portions AMP of the pixels P(2, 1), P(3, 1), and P(4, 1) equivalently function as one amplifying portion. Whether the four pixels P(1, 1), P(2, 1), P(3, 1), and P(4, 1) sharing the reset portion RST and the amplifying portions AMP output signals corresponding to the charges of the signal storage portions PD separately or add the signals and output them can be adjusted by the timing of ON/OFF of the transfer portions TR of the four pixels P(1, 1), P(2, 1), P(3, 1), and P(4, 1). The charge-voltage conversion portion FD (the semiconductor region SR3) of the pixel P(1, 1), the charge-voltage conversion portion FD (the semiconductor region SR3) of the pixel P(2, 1), the charge-voltage conversion portion FD (the semiconductor region SR3) of the pixel P(3, 1), and the charge-voltage conversion portion FD (the semiconductor region SR3) of the pixel P(4, 1) on the layout configuration illustrated in FIG. 24 are electrically connected to each other by a wire and have substantially the same voltage. Accordingly, as illustrated in FIG. 25, the charge-voltage conversion portions FD function as a single charge-voltage conversion element shared by the pixels P(1, 1), P(2, 1), P(3, 1), and P(4, 1) from a circuit configuration viewpoint.

In this manner, there can be a plurality of the amplifying portions AMP to be shared if the reset portion RST and the amplifying portions AMP are shared among three or more pixels P, and the reset portion RST and the amplifying portions AMP are distributed and placed in the plurality of sharing pixels P. Consequently, if the area of each pixel in the planar direction is made smaller, the output signal of each pixel P is output by the amplifying portions (amplifier transistors) AMP having an effectively increased channel width due to parallel connection, and the increase of random noise can be further suppressed.

Alternatively, in addition to the reset portion RST and the amplifying portions AMP, a selection portion ADR may be shared among three or more pixels P, and the reset portion RST, the amplifying portions AMP, and the selection portion ADR may be distributed and placed in the plurality of sharing pixels P.

In other words, the selection portion ADR, instead of the reset portion RST, performs an operation to put the pixel P in the selected/non-selected state. Accordingly, the potential on the drain side of the reset portion RST may be fixed (for example, to VDD). The selection portion ADR is, for example, a selection transistor, and puts the pixel P in the selected state by being turned on when the control signal at the active level is supplied to the gate ADRG, and puts the pixel P in the non-selected state by being turned off when the control signal at the non-active level is supplied to the gate ADRG.

Figure 26:
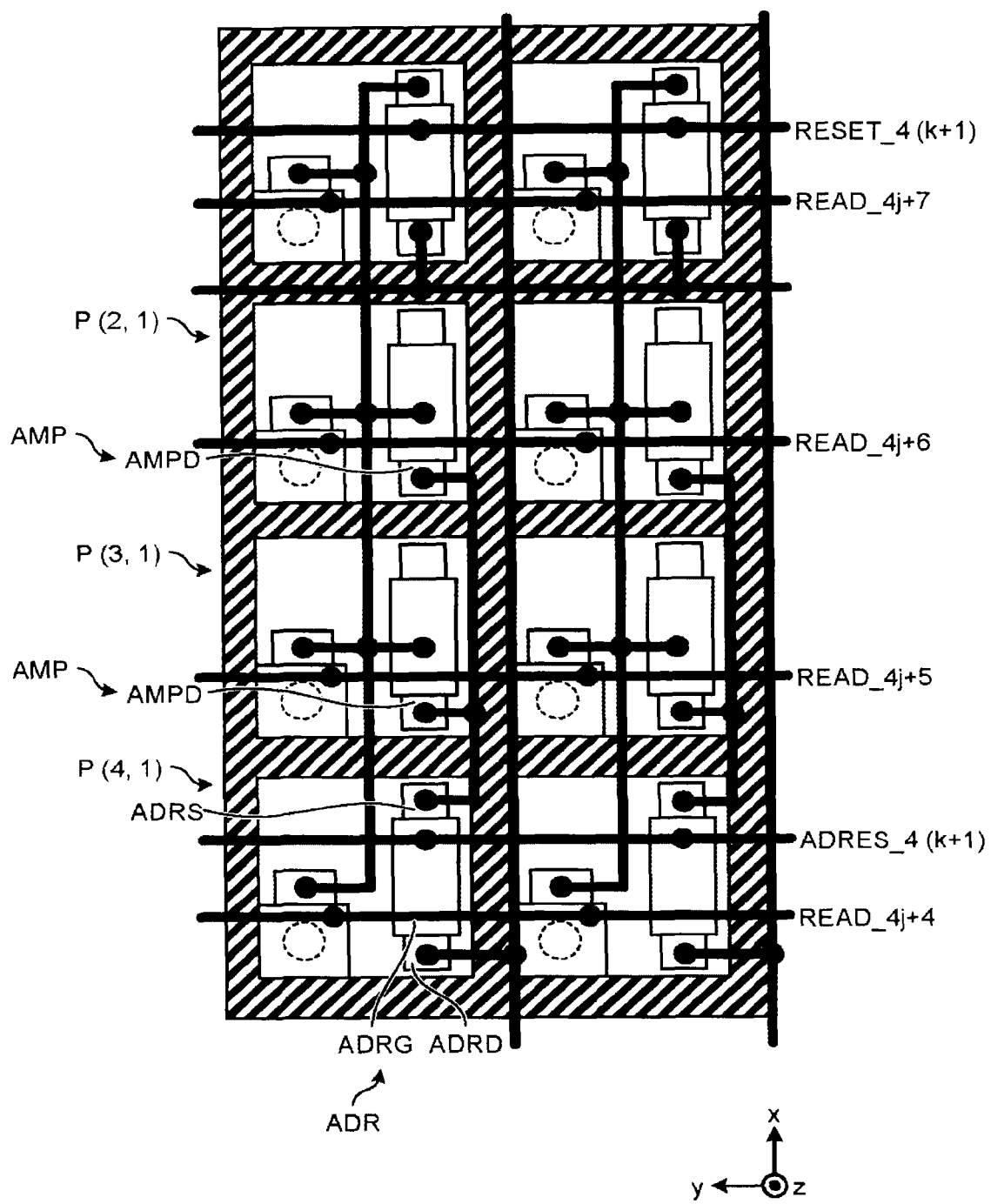
FIG. 26 is a diagram illustrating a configuration of a solid-state imaging device according to another modification of the second embodiment.
Figure 27:
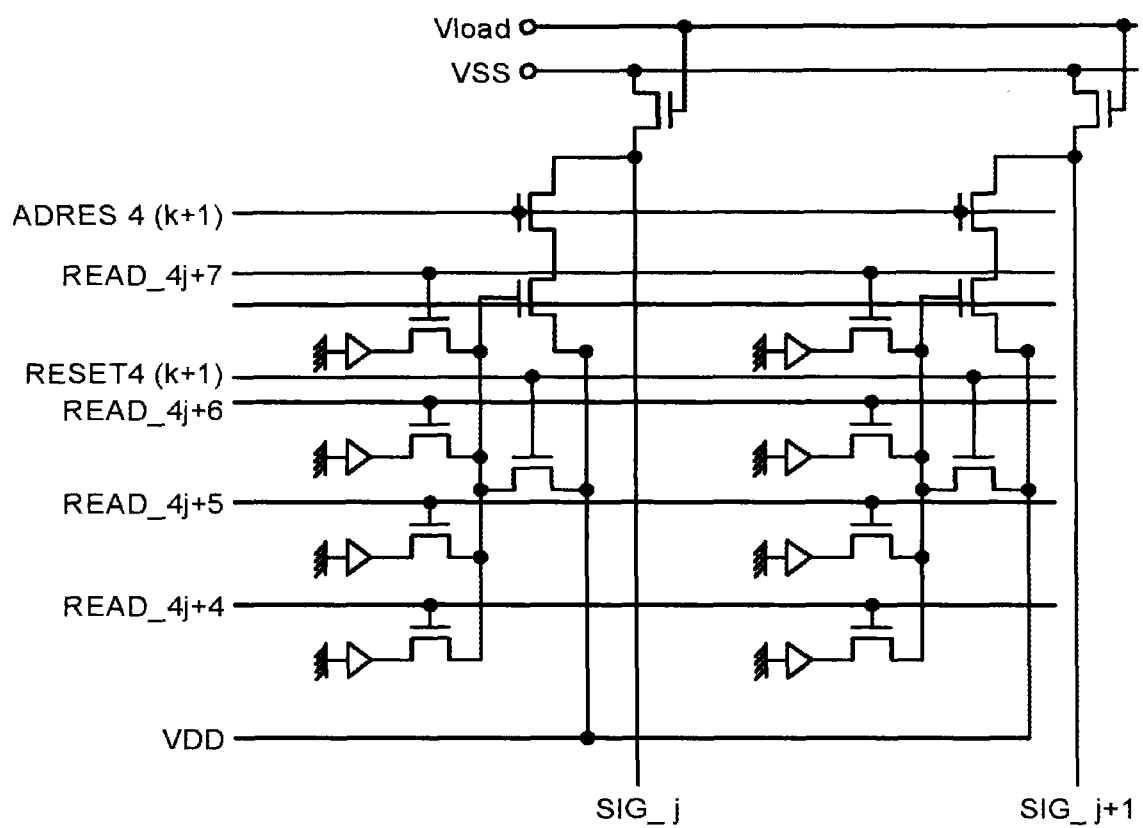
FIG. 27 is a diagram illustrating the configuration of the solid-state imaging device according to the other modification of the second embodiment.

For example, in the four pixels P(1, 1), P(2, 1), P(3, 1), and P(4, 1) illustrated in FIG. 24, the amplifying portion AMP of the pixel P(4, 1) is replaced with the selection portion ADR, the drain of the selection portion ADR (selection transistor) is connected to the source of the amplifying portion AMP of each of the pixels P(2, 1) and P(3, 1). FIG. 26 is a diagram illustrating the planar arrangement of a solid-state imaging device that is the solid-state imaging device 205i modified as described above. FIG. 27 is a diagram illustrating the circuit configuration of the solid-state imaging device that is the solid-state imaging device 25i modified as above. Also in this case, the number of elements (the number of transistors) to be placed for each pixel P can be reduced compared with the configuration where the reset portion RST, the amplifying portion AMP, and the selection portion ADR are provided to each pixel P. The charge-voltage conversion portion FD (the semiconductor region SR3) of the pixel P(1, 1), the charge-voltage conversion portion FD (the semiconductor region SR3) of the pixel P(2, 1), the charge-voltage conversion portion FD (the semiconductor region SR3) of the pixel P(3, 1), and the charge-voltage conversion portion FD (the semiconductor region SR3) of the pixel P(4, 1) on the layout configuration illustrated in FIG. 26 are electrically connected to each other by a wire and have substantially the same voltage. Accordingly, as illustrated in FIG. 27, the charge-voltage conversion portions FD function as a single charge-voltage conversion element shared by the pixels P(1, 1), P(2, 1), P(3, 1), and P(4, 1) from a circuit configuration viewpoint.

In the first and second embodiments, the explanation has been given by example where the element isolation portion DTI extends in a grid form in planar view (see FIG. 13). However, if, in cross-sectional view, the element isolation portion DTI extends in the depth direction from the front surface SBa of the semiconductor substrate SB and penetrates through to the back surface SBb of the semiconductor substrate SB, when the element isolation portion DTI extends in a grid form in planar view, it is necessary to stabilize the potential of the semiconductor substrate SB on a pixel basis by providing a substrate contact to each pixel.

Figure 28:
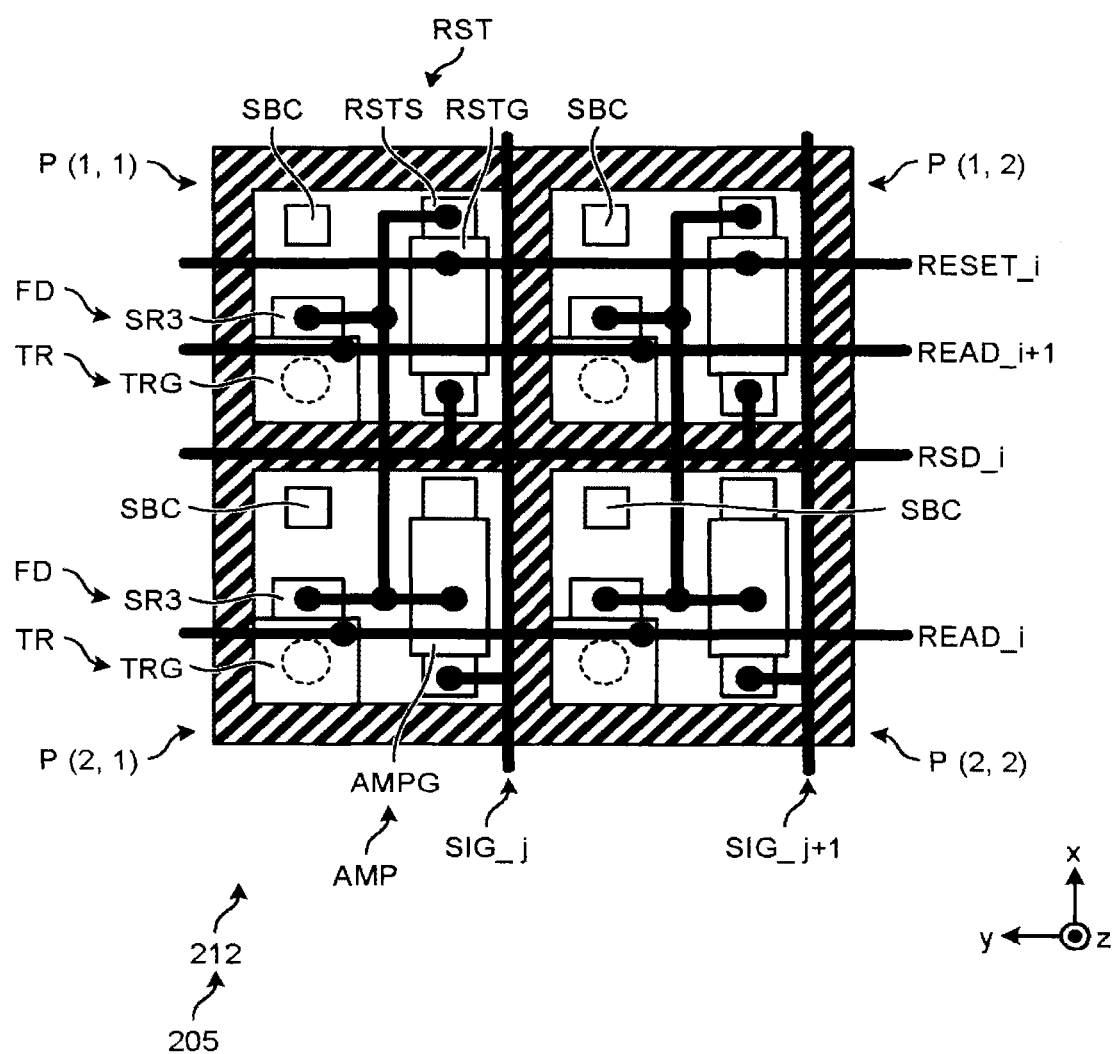
FIG. 28 is a diagram illustrating planar arrangement when a substrate contact is placed for each pixel in the first and second embodiments.

For example, if the element isolation portion DTI provided between pixels penetrates from the front surface SBa to the back surface SBb (see FIG. 4B), and surrounds all the boundaries in each direction between pixels (see FIG. 13), a semiconductor region of a pixel is completely disconnected on a pixel basis. In this case, as illustrated in FIG. 28, in terms of a first conductive type well (for example, P-well) of a MOS transistor configuring a signal read-out circuit of a pixel, it is necessary to provide a substrate contact SBC that is electrically continuous to the P-well (see FIG. 4B) to the front surface SBa of the semiconductor substrate SB, connect a substrate wire to the substrate contact SBC, and apply a reference potential to the substrate wire in order to fix the P-well at the reference potential on a pixel basis. FIG. 28 is a diagram illustrating the planar arrangement of when the substrate contact SBC is provided to each pixel. In FIGS. 4 to 27, the illustration and explanation of the substrate contact SBC are omitted for simplification.

In this manner, if a substrate contact is provided to each pixel, the reductions of the width Wx in the x direction and the width Wy in the y direction of each pixel P (see FIG. 4A) may be restricted due to the existence of the substrate contact.

Figure 29:
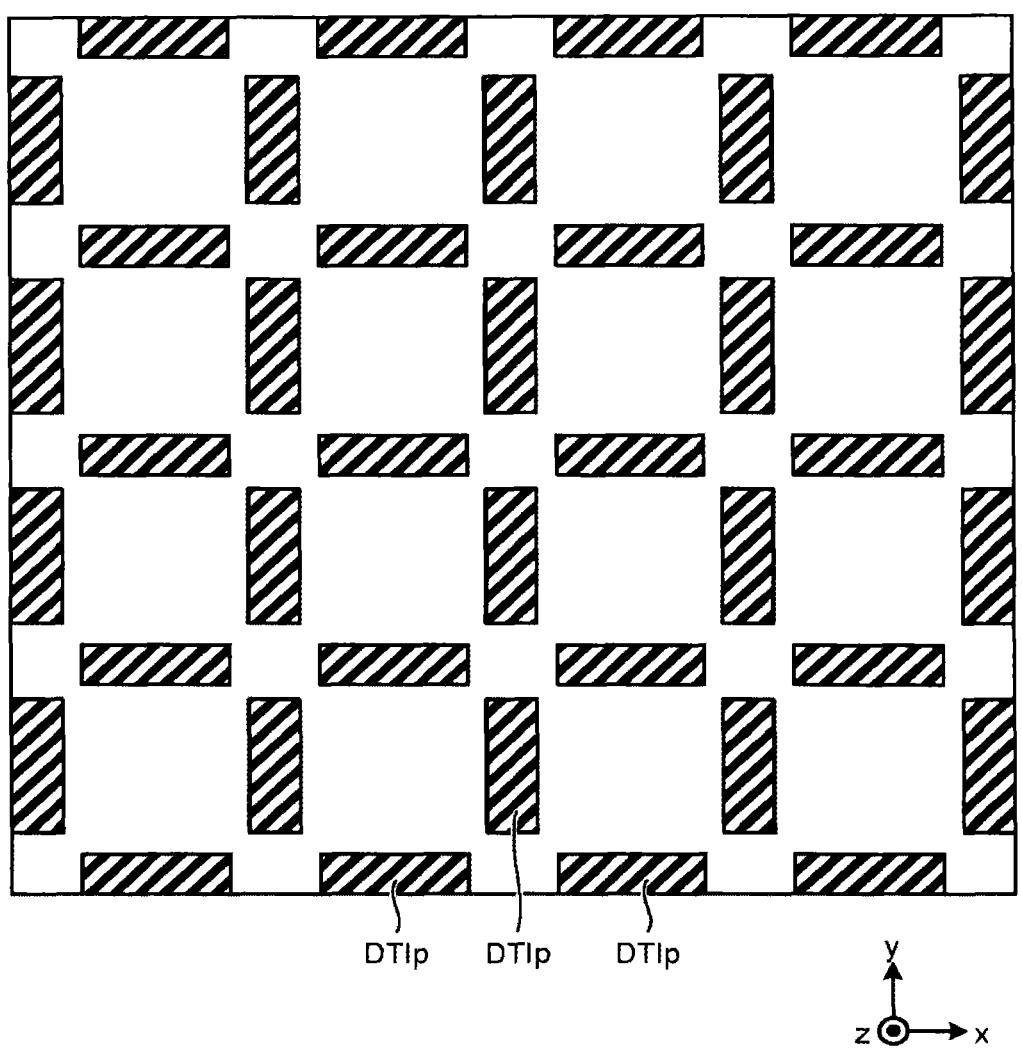
FIG. 29 is a diagram illustrating a configuration of a element isolation portion in a modification of the first and second embodiments.
Figure 31:
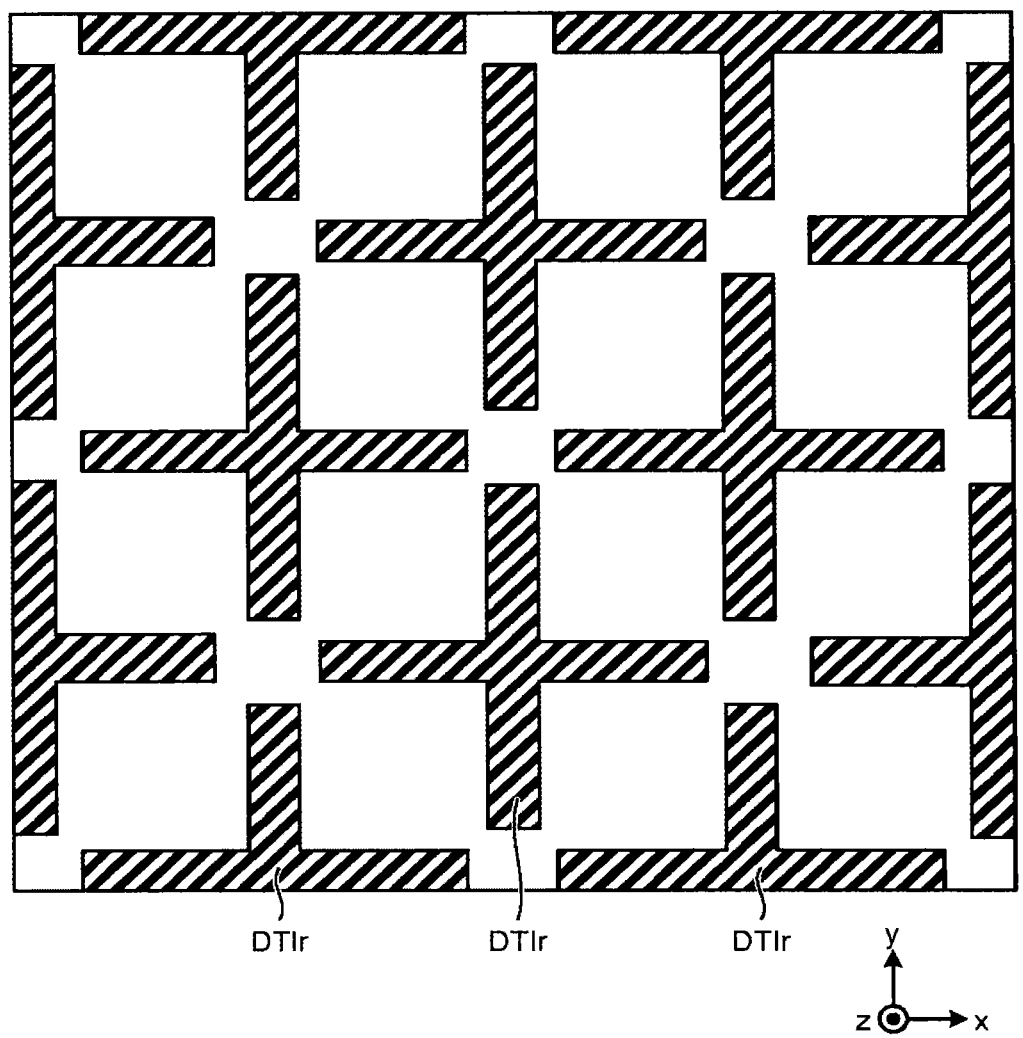
FIG. 31 is a diagram illustrating a configuration of a element isolation portion in another modification of the first and second embodiments.

Hence, for example, as illustrated in FIGS. 29 and 31, the element isolation portion can be configured in a pattern where parts of the grid-like pattern are removed and the pattern is made discontinuous in planar view.

Figure 30:
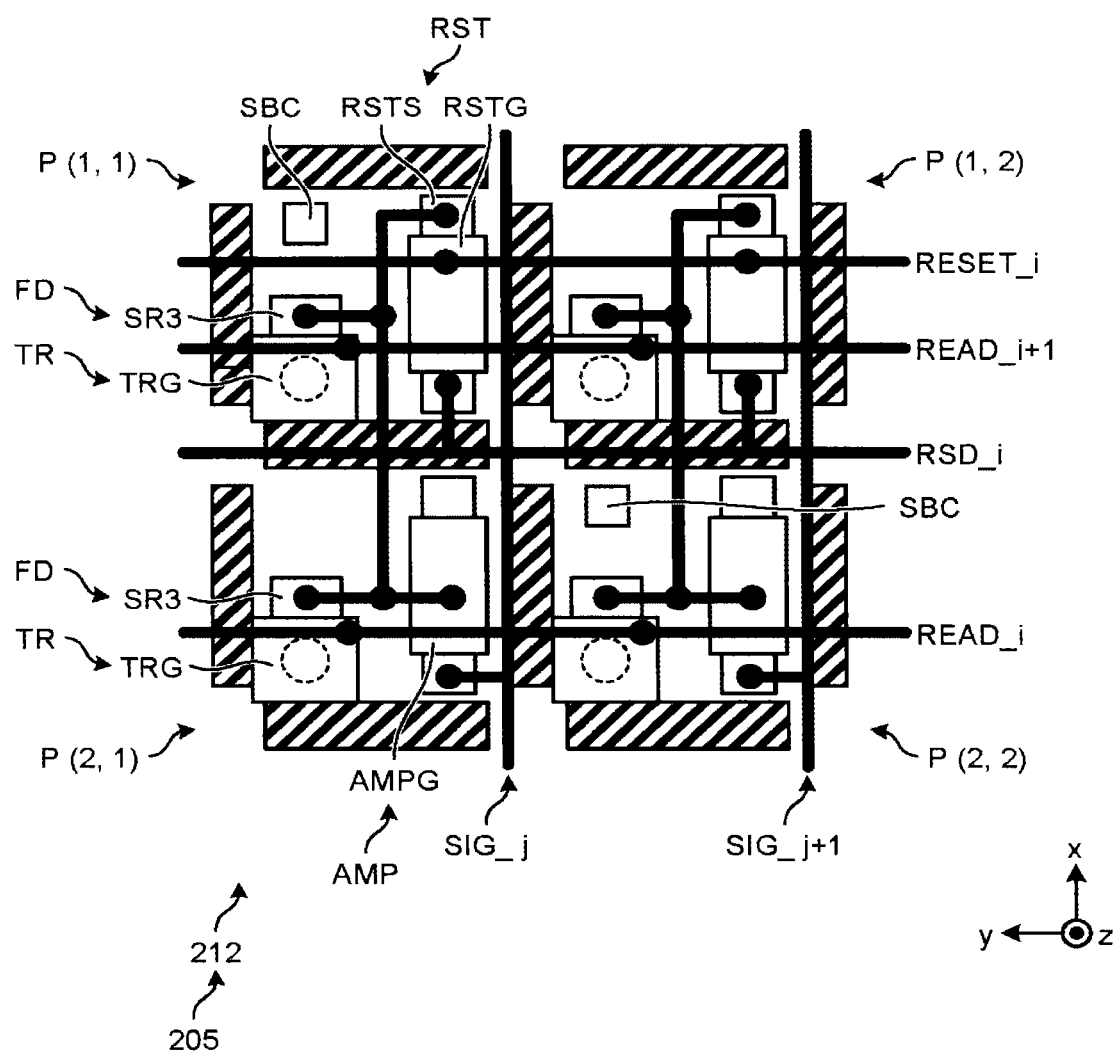
FIG. 30 is a diagram illustrating planar arrangement when one substrate contact is placed for a plurality of pixels in the modification of the first and second embodiments.

In the case of FIG. 29, an element isolation portion DTIp is configured in a pattern of being separated by one pixel pitch in the x and y directions in planar view. In other words, if a semiconductor region of a pixel and a semiconductor region of an adjacent pixel are not partially disconnected from each other by the element isolation portion DTIp but become continuous, there is no need to provide a substrate contact to each pixel and apply the reference potential. For example, if the element isolation portion DTIp penetrates from the front surface SBa to the back surface SBb (see FIG. 4B), but parts of the element isolation portion DTIp are discontinuous on the boundaries of pixels as illustrated in FIG. 30, it is simply required that the number of the substrate contacts SBC to which the reference potential is applied is one for a plurality of pixels. FIG. 30 illustrates by example a configuration where one substrate contact SBC is provided to every two pixels if parts of the element isolation portion DTIp are discontinuous on the boundaries of pixels.

Alternatively, in the case of FIG. 31, an element isolation portion DTIr is configured in a pattern of being separated by a two-pixel pitch in the x and y directions in planar view.

In this manner, with the configuration where the element isolation portion is discontinuous on the boundaries of pixels in planar view, the semiconductor substrate SB can be partially electrically connected on a pixel basis. Accordingly, the need of providing a substrate contact to each pixel is eliminated and it becomes possible to easily reduce the width Wx in the x direction and the width Wy in the y direction of each pixel P.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a plurality of pixels arranged on a semiconductor substrate, the plurality of pixels each including a signal storage portion; and
   a DTI (Deep Trench Isolation) type element isolation portion that electrically separates the plurality of pixels on the semiconductor substrate from each other, wherein
   the signal storage portion in each of the plurality of pixels includes
      a first semiconductor region of a first conductive type, the first semiconductor region covering a side wall of the element isolation portion on a side of the signal storage portion, and
      a second semiconductor region of a second conductive type, the second conductive type being an opposite conductive type to the first conductive type, the second semiconductor region being arranged vertically in a depth direction from a deeper position than a front surface in the semiconductor substrate and extending in a plate shape along the first semiconductor region, the second semiconductor region having a substantially L-shape when seen through from a direction perpendicular to the front surface of the semiconductor substrate.

2. The solid-state imaging device according to claim 1, wherein
the first semiconductor region extends along a square tube including
a first surface, and
second surface intersecting with the first surface on a first cross line, and
the second semiconductor region includes
a first section extending in a plate shape along the first surface up to a position corresponding to the first cross line, and
a second section extending in a plate shape along the second surface from the position corresponding to the first cross line.

3. The solid-state imaging device according to claim 2, wherein
each of the plurality of pixels further includes a trench gate extending in the depth direction up to the vicinity of the second semiconductor region from a position corresponding to the first cross line on the front surface of the semiconductor substrate.

4. The solid-state imaging device according to claim 1, wherein
the first semiconductor region includes
a first sectional region, and
a second sectional region in a deeper position than the first sectional region
with respect to the front surface of the semiconductor substrate, and
concentration of the first conductive type impurities in the first sectional region is lower than concentration of the first conductive type impurities in the second sectional region.

5. The solid-state imaging device according to claim 1, wherein
the signal storage portion in each of the plurality of pixels further includes a fourth semiconductor region of the first conductive type, covering the second semiconductor region from an opposite side to the first semiconductor region, and
an interface between the second and fourth semiconductor regions is along an interface between the second and first semiconductor regions.

6. The solid-state imaging device according to claim 1, wherein
the signal storage portion in each of the plurality of pixels further includes a fourth semiconductor region arranged in a depth position substantially equal to the second semiconductor region in the semiconductor substrate, the fourth semiconductor region defining a boundary of the second semiconductor region on an opposite side to the first semiconductor region.

7. The solid-state imaging device according to claim 1, wherein
the element isolation portion is configured in a pattern where parts of a grid-like pattern are removed and the pattern is made discontinuous in planar view.

8. A solid-state imaging device comprising:
a plurality of pixels arranged on a semiconductor substrate, the plurality of pixels each including a signal storage portion; and
a DTI (Deep Trench Isolation) type element isolation portion that electrically separates the plurality of pixels on the semiconductor substrate from each other, wherein
the signal storage portion in each of the plurality of pixels includes
a first semiconductor region of a first conductive type, the first semiconductor region covering a side wall of the element isolation portion on a side of the signal storage portion, and
a second semiconductor region of a second conductive type, the second conductive type being an opposite conductive type to the first conductive type, the second semiconductor region being arranged vertically in a depth direction from a deeper position than a front surface in the semiconductor substrate and extending in a plate shape along the first semiconductor region, the second semiconductor region having a substantially U-shape when seen through from a direction perpendicular to the front surface of the semiconductor substrate.

9. The solid-state imaging device according to claim 8, wherein
the first semiconductor region extends along a square tube including
a first surface,
a second surface intersecting with the first surface on a first cross line, and
a third surface intersecting with the second surface on a second cross line on an opposite side to the first cross line, and
the second semiconductor region includes
a first section extending in a plate shape along the first surface up to a position corresponding to the first cross line,
a second section extending in a plate shape along the second surface from the position corresponding to the first cross line up to a position corresponding to the second cross line, and
a third section extending along the third surface from the position corresponding to the second cross line.

10. The solid-state imaging device according to claim 9, wherein
each of the plurality of pixels further includes a trench gate extending in the depth direction up to the vicinity of the second semiconductor region from a position corresponding to a space between the first cross line and the second cross line on the front surface of the semiconductor substrate.

11. The solid-state imaging device according to claim 8, wherein
the first semiconductor region includes
a first sectional region, and
a second sectional region in a deeper position than the first sectional region with respect to the front surface of the semiconductor substrate, and
concentration of the first conductive type impurities in the first sectional region is lower than concentration of the first conductive type impurities in the second sectional region.

12. The solid-state imaging device according to claim 8, wherein
the signal storage portion in each of the plurality of pixels further includes a fourth semiconductor region of the first conductive type, covering the second semiconductor region from an opposite side to the first semiconductor region, and
an interface between the second and fourth semiconductor regions is along an interface between the second and first semiconductor regions.

13. The solid-state imaging device according to claim 8, wherein the signal storage portion in each of the plurality of pixels further includes a fourth semiconductor region arranged in a depth position substantially equal to the second semiconductor region in the semiconductor substrate, the fourth semiconductor region defining a boundary of the second semiconductor region on an opposite side to the first semiconductor region.

14. The solid-state imaging device according to claim 8, wherein
the element isolation portion is configured in a pattern where parts of a grid-like pattern are removed and the pattern is made discontinuous in planar view.

15. A solid-state imaging device comprising:
a plurality of pixels arranged on a semiconductor substrate, the plurality of pixels each including a signal storage portion; and
a DTI (Deep Trench Isolation) type element isolation portion that electrically separates the plurality of pixels on the semiconductor substrate from each other, wherein
the signal storage portion in each of the plurality of pixels includes
a first semiconductor region of a first conductive type, the first semiconductor region covering a side wall of the element isolation portion on a side of the signal storage portion, and
a second semiconductor region of a second conductive type, the second conductive type being an opposite conductive type to the first conductive type, the second semiconductor region being arranged vertically in a depth direction from a deeper position than a front surface in the semiconductor substrate and extending in a plate shape along the first semiconductor region, the second semiconductor region having a substantially O-shape when seen through from a direction perpendicular to the front surface of the semiconductor substrate.

16. The solid-state imaging device according to claim 15, wherein
the first semiconductor region extends along a square tube including
a first surface,
a second surface intersecting with the first surface on a first cross line,
a third surface intersecting with the second surface on a second cross line on an opposite side to the first cross line, and
fourth surface intersecting with the third surface on a third cross line on an opposite side to the second cross line, and
the second semiconductor region includes
a first section extending in a plate shape along the first surface up to a position corresponding to the first cross line,
a second section extending in a plate shape along the second surface from the position corresponding to the first cross line up to a position corresponding to the second cross line,
a third section extending in a plate shape along the third surface from the position corresponding to the second cross line up to a position corresponding to the third cross line, and
a fourth section extending in a plate shape along the fourth surface from the position corresponding to the third cross line.

17. The solid-state imaging device according to claim 16, wherein concentrations of the second conductive type impurities in the third and fourth sections are lower than concentrations of the second conductive type impurities in the first and second sections, and
each of the plurality of pixels further includes a trench gate extending in the depth direction up to the vicinity of the second semiconductor region from a position corresponding to the first cross line on the front surface of the semiconductor substrate.

18. The solid-state imaging device according to claim 15, wherein
the second semiconductor region has a substantially reverse U-shape when seen through from a direction along the front surface of the semiconductor substrate.

19. The solid-state imaging device according to claim 18, wherein
the first semiconductor region extends along a square tube including
a first surface,
a second surface intersecting with the first surface on a first cross line,
a third surface intersecting with the second surface on a second cross line on an opposite side to the first cross line, and
a fourth surface intersecting with the third surface on a third cross line on an opposite side to the second cross line, and
the second semiconductor region includes
a first section extending in a plate shape along the first surface up to a position corresponding to the first cross line,
a second section extending in a plate shape along the second surface from the position corresponding to the first cross line up to a position corresponding to the second cross line,
a third section extending in a plate shape along the third surface from the position corresponding to the second cross line up to a position corresponding to the third cross line,
a fourth section extending in a plate shape along the fourth surface from the position corresponding to the third cross line, and
a fifth section extending in a plate shape along the front surface of the semiconductor substrate in such a manner as to cover ends of the first, second, third, and fourth sections on the front surface side of the semiconductor substrate.

20. The solid-state imaging device according to claim 19, wherein
concentration of the second conductive type impurities in the fifth section is lower than concentrations of the second conductive type impurities in the third and fourth sections,
concentrations of the second conductive type impurities in the third and fourth sections are lower than concentrations of the second conductive type impurities in the first and second sections, and
each of the plurality of pixels further includes a trench gate extending in the depth direction up to the vicinity of the second semiconductor region from a position corresponding to the first cross line on the front surface of the semiconductor substrate.

21. The solid-state imaging device according to claim 20, wherein
the first semiconductor region includes
a first sectional region, and a second sectional region in a deeper position than the first sectional region with respect to the front surface of the semiconductor substrate, and concentration of the first conductive type impurities in the first sectional region is lower than concentration of the first conductive type impurities in the second sectional region.

22. The solid-state imaging device according to claim 20, wherein the signal storage portion in each of the plurality of pixels further includes a fourth semiconductor region of the first conductive type, covering the second semiconductor region from an opposite side to the first semiconductor region, and an interface between the second and fourth semiconductor regions is along an interface between the second and first semiconductor regions.

23. The solid-state imaging device according to claim 20, wherein the signal storage portion in each of the plurality of pixels further includes a fourth semiconductor region arranged in a depth position substantially equal to the second semiconductor region in the semiconductor substrate, the fourth semiconductor region defining a boundary of the second semiconductor region on an opposite side to the first semiconductor region.

24. The solid-state imaging device according to claim 20, wherein the element isolation portion is configured in a pattern where parts of a grid-like pattern are removed and the pattern is made discontinuous in planar view.

25. A solid-state imaging device comprising:

a plurality of pixels arranged on a semiconductor substrate, the plurality of pixels each including a signal storage portion; and a DTI (Deep Trench Isolation) type element isolation portion that electrically separates the plurality of pixels on the semiconductor substrate from each other, wherein the signal storage portion in each of the plurality of pixels includes a first semiconductor region of a first conductive type, the first semiconductor region covering a side wall of the element isolation portion on a side of the signal storage portion, and a second semiconductor region of a second conductive type, the second conductive type being an opposite conductive type to the first conductive type, the second semiconductor region being arranged vertically in a depth direction from a deeper position than a front surface in the semiconductor substrate and extending in a plate shape along the first semiconductor region, wherein the plurality of pixels includes a first pixel and a second pixel adjacent to the first pixel, each of the first and second pixels has a charge-voltage conversion portion that converts charges of the signal storage portion into a voltage, the charge-voltage conversion portion placed in the first pixel and the charge-voltage conversion portion placed in the second pixel are electrically connected to each other and function as a single charge-voltage conversion element shared between the first and second pixels, the first pixel has a reset portion placed in the first pixel, the reset portion being shared between the first and second pixels in such a manner as to reset the voltage of the charge-voltage conversion element, and the second pixel has an amplifying portion placed in the second pixel, the amplifying portion being shared between the first and second pixels in such a manner as to output, to a signal line, a signal corresponding to the voltage of the charge-voltage conversion element and wherein the plurality of pixels includes the first pixel and a plurality of the second pixels, and the plurality of second pixels includes amplifying portion group divided and placed in each of the plurality of the second pixels, the amplifying portion group being shared between the first pixel and the plurality of second pixels in such a manner as to output, to the signal line, a signal corresponding to the voltage of the charge-voltage conversion element.

26. The solid-state imaging device according to claim 25, wherein the amplifying portion group includes a plurality of amplifier transistors placed in the second pixels different from each other among the plurality of second pixels, and the plurality of amplifier transistors is connected at sources thereof via the signal line and connected at drains thereof via a power supply line, and accordingly is connected in parallel between the charge-voltage conversion element and the signal line.

27. The solid-state imagine device according to claim 25, wherein the element isolation portion is configured in a pattern where parts of a grid-like pattern are removed and the pattern is made discontinuous in planar view.

* * * * *